US012762446B2

(12) United States Patent
Takeuchi et al.

(10) Patent No.: US 12,762,446 B2
(45) Date of Patent: Oct. 13, 2026

(54) MAGNETIC FLUX BIAS CIRCUIT

(71) Applicants: NATIONAL UNIVERSITY CORPORATION YOKOHAMA NATIONAL UNIVERSITY, Kanagawa (JP); NEC CORPORATION, Tokyo (JP); NATIONAL INSTITUTE OF ADVANCED INDUSTRIAL SCIENCE AND TECHNOLOGY, Tokyo (JP)

(72) Inventors: Naoki Takeuchi, Yokohama (JP); Nobuyuki Yoshikawa, Yokohama (JP); Yoshihito Hashimoto, Tokyo (JP); Tsuyoshi Yamamoto, Tokyo (JP); Fuminori Hirayama, Tsukuba (JP)

(73) Assignees: NEC CORPORATION, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 522 days.

(21) Appl. No.: 18/286,719

(22) PCT Filed: Apr. 13, 2022

(86) PCT No.: PCT/JP2022/017657
§ 371 (c)(1),
(2) Date: Oct. 12, 2023

(87) PCT Pub. No.: WO2022/220254
PCT Pub. Date: Oct. 20, 2022

(65) Prior Publication Data
US 2024/0202560 A1 Jun. 20, 2024

(30) Foreign Application Priority Data
Apr. 14, 2021 (JP) ................................ 2021-068575

(51) Int. Cl.
*G06N 10/20* (2022.01)
*G01R 33/00* (2006.01)
(Continued)

(52) U.S. Cl.
CPC ......... *G06N 10/20* (2022.01); *G01R 33/0011* (2013.01); *G01R 33/035* (2013.01);
(Continued)

(58) Field of Classification Search
CPC .. G06N 10/20; G01R 33/0011; G01R 33/035; H02M 7/003; H03M 1/66; H03M 1/1009
See application file for complete search history.

(56) References Cited

U.S. PATENT DOCUMENTS

2020/0111016 A1* 4/2020 Boothby ................ H10N 60/12

FOREIGN PATENT DOCUMENTS

JP 2001-345695 A 12/2001
JP 2007-5959 A 1/2007
(Continued)

OTHER PUBLICATIONS

International Search Report for PCT/JP2022/017657 dated Jun. 28, 2022, U.S. Appl. No. 18/286,719.

*Primary Examiner* — Joseph J Lauture
(74) *Attorney, Agent, or Firm* — Sughrue Mion, PLLC

(57) ABSTRACT

A magnetic flux bias circuit includes an input signal line to which an input signal indicating an applied magnetic flux using a digital value is input, a first current control line, a second current control line, and a third current control line to which a clock signal according to the input signal is input, a digital/analog conversion unit converting the input signal into an analog signal using a circuit including a quantum flux parametron circuit on the basis of the input signal input to the input signal line and the clock signal input to the first current control line, the second current control line, and the
(Continued)

third current control line, and a magnetic flux application unit applying an applied magnetic flux to a controlled object on the basis of the analog signal output from the digital/analog conversion unit.

7 Claims, 17 Drawing Sheets

(51) Int. Cl.

| | |
|---|---|
| ***G01R 33/035*** | (2006.01) |
| ***H02M 7/00*** | (2006.01) |
| *H03M 1/10* | (2006.01) |
| *H03M 1/66* | (2006.01) |

(52) U.S. Cl.

CPC .......... *H02M 7/003* (2013.01); *H03M 1/1009* (2013.01); *H03M 1/66* (2013.01)

(56) References Cited

FOREIGN PATENT DOCUMENTS

| | | | |
|---|---|---|---|
| JP | 2010-511946 | A | 4/2010 |
| JP | 2019-521546 | A | 7/2019 |
| WO | 2008067664 | A1 | 6/2008 |
| WO | 2017192733 | A2 | 11/2017 |

* cited by examiner

| DIGITAL INPUT | $I_{qfp4}$ | $I_{qfp3}$ | $I_{qfp2}$ | $I_{qfp1}$ | APPLIED MAGNETIC FLUX |
|---|---|---|---|---|---|
| 0000 | − | − | − | − | −4Φ |
| 0100 | − | + | − | − | −2Φ |
| 0101 | − | + | − | + | 0 |
| 0111 | − | + | + | + | 2Φ |
| 1111 | + | + | + | + | 4Φ |

FIG. 9

| DIGITAL INPUT | $I_{qfp4}$ | $I_{qfp3}$ | $I_{qfp2}$ | $I_{qfp1}$ | APPLIED MAGNETIC FLUX |
|---|---|---|---|---|---|
| 0000 | − | − | − | − | −6Φ |
| 0001 | − | − | − | + | −4Φ |
| 0100 | − | + | − | − | −2Φ |
| 0101 | − | + | − | + | 0 |
| 0111 | − | + | + | + | 2Φ |
| 1101 | + | + | − | + | 4Φ |
| 1111 | + | + | + | + | 6Φ |

200

1e

MAGNETIC FLUX BIAS CIRCUIT

This Application is a National Stage of International Application No. PCT/JP2022/017657 filed Apr. 13, 2022, claiming priority based on Japanese Patent Application No. 2021-068575 filed Apr. 14, 2021.

TECHNICAL FIELD

The present invention relates to a magnetic flux bias circuit.

Priority is claimed on Japanese Patent Application No. 2021-068575 filed on Apr. 14, 2021, the contents of which are incorporated herein by reference.

BACKGROUND ART

Quantum computers are expected to be applied to material design and drug discovery because they can simulate quantum systems configured by a large number of electrons. Quantum bits controlled in quantum computers are configured using superconducting elements, and therefore need to be controlled to have a low temperature. Therefore, a configuration of a quantum computer includes a refrigerator for maintaining quantum bits at a low temperature and a device operating at room temperature. The device operating at room temperature outputs a control signal to the quantum bits via a cable.

In quantum computers, a large number of cables are required to control a large number of quantum bits in a refrigerator. For example, 168 cables are required to control 72 quantum bits. However, since there is an upper limit to the number of cables that can be used to control the quantum bits, increasing the number of quantum bits is extremely difficult.

In order to realize a large-scale quantum computer, a control circuit operating at low temperatures is required similarly to with quantum bits. For example, a quantum computing system in which the number of communication lines is smaller than the number of devices to be controlled is known (Patent Document 1). A superconducting quantum processor having a superconducting digital/analog converter that uses a flux quantum parametron as a shift register is known (Patent Document 2).

CITATION LIST

Patent Document

[Patent Document 1]
Published Japanese Translation No. 2010-511946 of the PCT International Publication
[Patent Document 2]
Published Japanese Translation No. 2019-521546 of the PCT International Publication

SUMMARY OF INVENTION

Technical Problem

As described above, it is required to be able to control a large number of controlled objects such as quantum bits with a small number of control lines.

The present invention has been made in view of the above-described points and provides a magnetic flux bias circuit capable of controlling a large number of controlled objects with a small number of control lines.

Solution to Problem

The present invention has been made to solve the above-described problems and one aspect of the present invention is a magnetic flux bias circuit including an input signal line to which an input signal indicating an applied magnetic flux using a digital value is input, a first current control line, a second current control line, and a third current control line to which a clock signal according to the input signal is input, a digital/analog conversion unit converting the input signal into an analog signal using a circuit including a quantum flux parametron circuit on the basis of the input signal input to the input signal line and the clock signal input to the first current control line, the second current control line, and the third current control line, and a magnetic flux application unit applying an applied magnetic flux to a controlled object on the basis of the analog signal output from the digital/analog conversion unit.

Also, in the magnetic flux bias circuit according to one aspect of the present invention, the digital/analog conversion unit and the magnetic flux application unit may each be provided in a number corresponding to the number of the controlled objects.

Also, in the magnetic flux bias circuit according to one aspect of the present invention, the digital/analog conversion unit may include a digital/analog converter, and a shift register in which shift register elements based on a quantum flux parametron circuit are connected.

Also, in the magnetic flux bias circuit according to one aspect of the present invention, the digital/analog conversion unit may include the digital/analog converter in a number corresponding to the number of bits of the input signal, the shift register elements may be connected in multiple stages corresponding to the number of bits in the shift register, the shift register may include a first shift register element, a second shift register element, a third shift register element, and a fourth shift register element in each of the multiple stages corresponding to the number of bits, in each of the multiple stages, the first shift register element, the second shift register element, and the fourth shift register element may be connected in series by the input signal line in an order of the first shift register element, the second shift register element, and the fourth shift register element, and the third shift register element and the fourth shift register element may be connected in parallel by the input signal line, in each of the multiple stages, the clock signal may be input from the first current control line to the first shift register element, the clock signal may be input from the second current control line to the second shift register element, and the clock signal may be input from the third current control line to the third shift register element and the fourth shift register element, and the digital/analog converter may output the analog signal based on a current value output from the third shift register element in each of the multiple stages.

Also, in the magnetic flux bias circuit according to one aspect of the present invention, the number of digital/analog converters included in the digital/analog conversion unit may be larger than the number of bits, and a plurality of the digital/analog converters may be associated with one or more bits among the bits of the input signal.

Also, the magnetic flux bias circuit according to one aspect of the present invention may further include a hold signal line to which a hold signal for holding a current value output from the shift register is input, in which the hold signal may be input to the digital/analog converter from the hold signal line.

Also, in the magnetic flux bias circuit according to one aspect of the present invention, the digital/analog converter may be a single flux quantum circuit holding a flux quantum within a superconducting loop on the basis of an input voltage pulse, and the magnetic flux bias circuit may further include an interface circuit converting a current output from the quantum flux parametron circuit into a voltage pulse, a reset signal line to which a reset signal for resetting the flux quantum held by the single flux quantum circuit is input, and a bias signal line to which a bias signal for biasing the superconducting loop is input, in which the interface circuit, the single flux quantum circuit, and the magnetic flux application unit may each be provided in a number corresponding to the number of the controlled objects, a plurality of the single flux quantum circuits may each hold a flux quantum within the superconducting loop on the basis of the voltage pulse output from each of a plurality of the interface circuits, and the magnetic flux application unit may apply an applied magnetic flux to each of a plurality of the controlled objects on the basis of the flux quantum held by each of the plurality of the single flux quantum circuits.

Advantageous Effects of Invention

According to the present invention, a large number of controlled objects can be controlled with a small number of control lines.

BRIEF DESCRIPTION OF DRAWINGS

FIG. 9 is a diagram showing an example of a relationship between an input signal and an applied magnetic flux according to the second embodiment of the present invention.

DESCRIPTION OF EMBODIMENTS

First Embodiment

Figure 1:
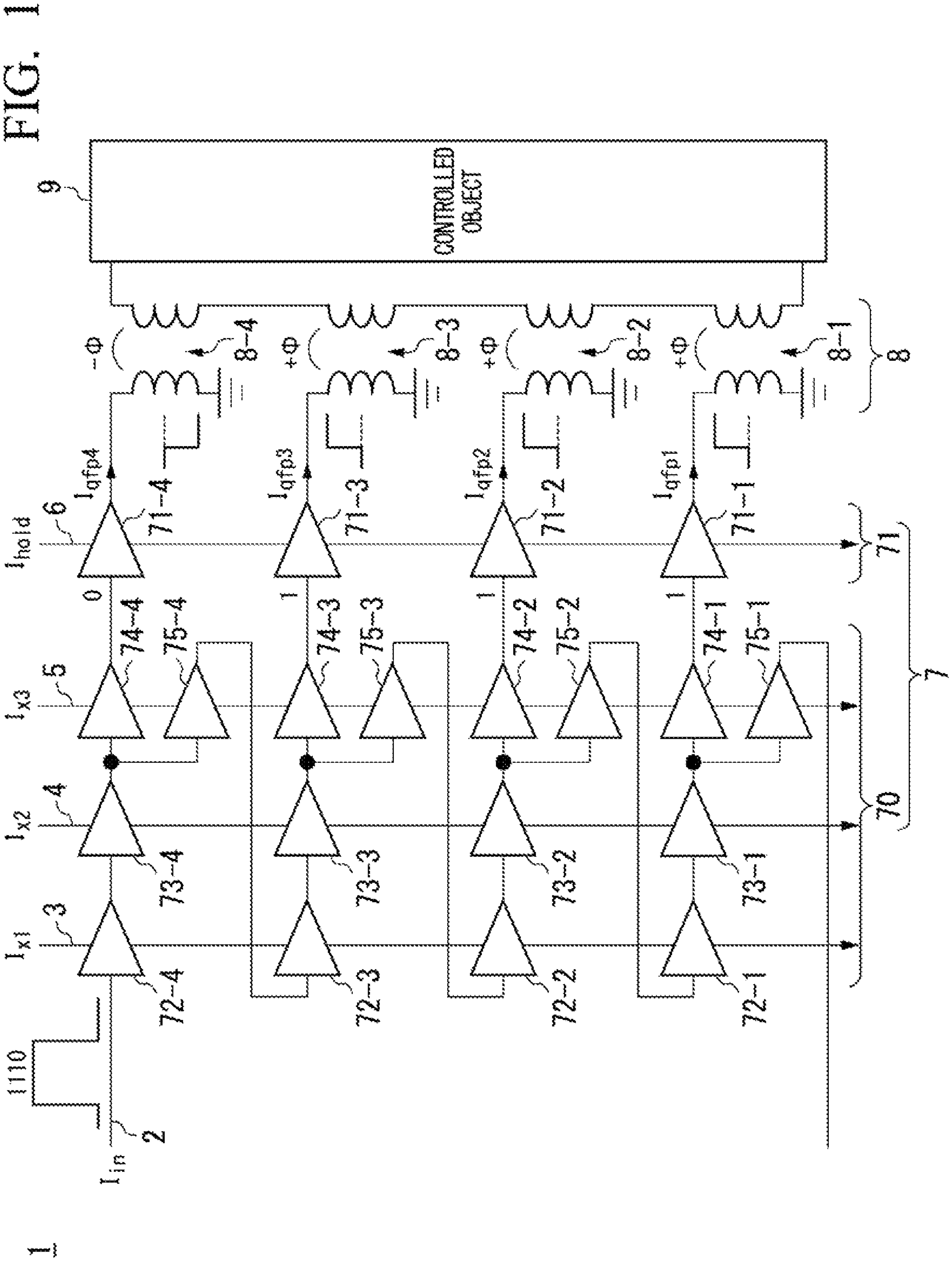
FIG. 1 is a diagram showing an example of a configuration of a magnetic flux bias circuit according to a first embodiment of the present invention.
Figure 2:
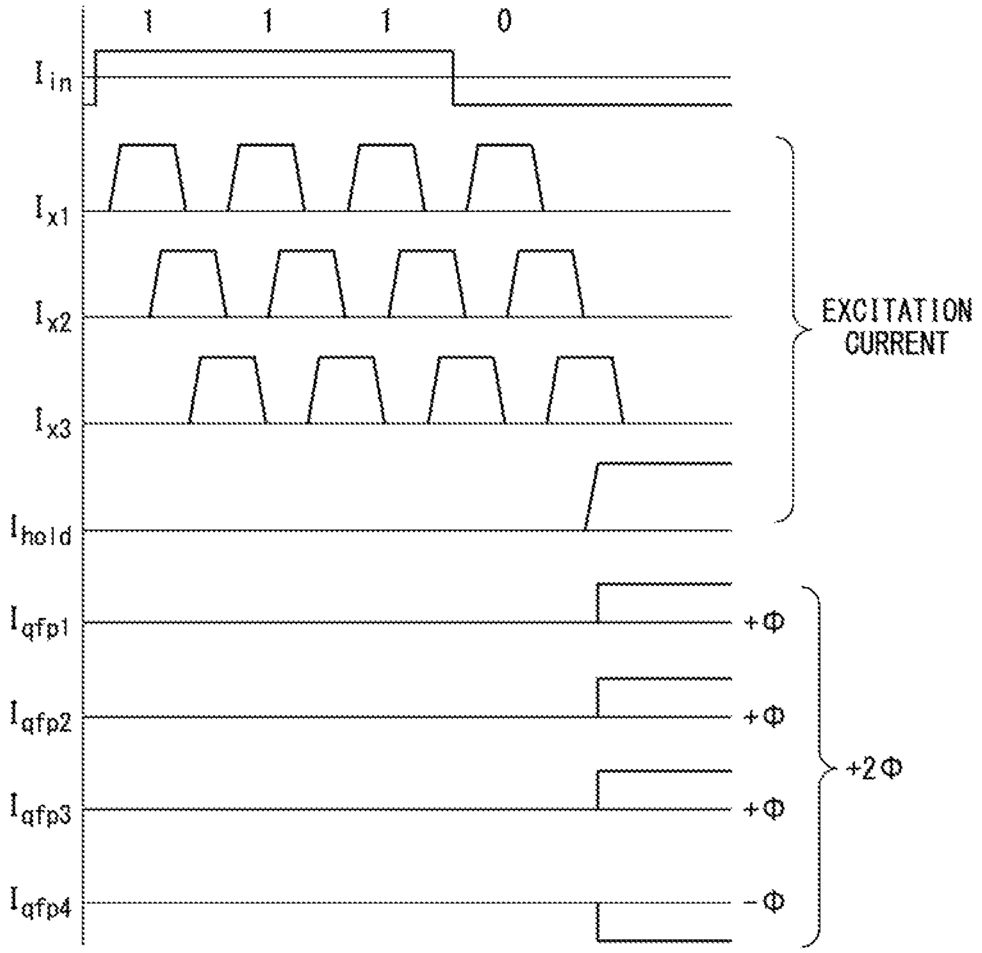
FIG. 2 is a diagram showing an example of various signals flowing through the magnetic flux bias circuit according to the first embodiment of the present invention.

Hereinafter, embodiments of the present invention will be described in detail with reference to the drawings. FIG. 1 is a diagram showing an example of a configuration of a magnetic flux bias circuit 1 according to the present embodiment. FIG. 2 is a diagram showing an example of various signals flowing through the magnetic flux bias circuit 1 according to the present embodiment. Further, FIG. 2 shows values of various signals in relation to time.

The magnetic flux bias circuit 1 is a circuit for applying a magnetic flux to a controlled object 9. The controlled object 9 includes various parts constituting a circuit of a quantum computer. The controlled object 9 is, for example, a quantum bit.

As will be described below, the magnetic flux bias circuit 1 includes a digital/analog converter based on a quantum flux parametron (QFP) as an example. A QFP is a circuit including a pair of Josephson junctions, and driven and clocked by an alternate current bias current (excitation current). In the QFP, Josephson junctions generate a signal current.

It is known that the QFP uses a superconducting element, and therefore has no direct current resistance and exhibits ultra-low power consumption. In the QFP, power consumption per gate is about 10 pW even in high-speed operation of several GHz. Also, in the QFP, a high-speed operation with a clock frequency of about 10 GHz is possible. Also, since the QFP exhibits ultra-low power consumption, it is possible to operate the QFP in the vicinity of the quantum bit. Further, the values of the power consumption and clock frequency of the QFP described above are examples, and these values may vary according to circuit parameters and types of circuit.

The magnetic flux bias circuit 1 includes an input signal line 2, a first current control line 3, a second current control line 4, a third current control line 5, a hold signal line 6, a shift register 70, a digital/analog converter 71, and a transformer 8.

The input signal line 2 is a control line to which an input signal Iin is input. The input signal Iin is a current that indicates an applied magnetic flux using a digital value. In the present embodiment, the number of bits of the input signal Iin is, for example, 4 bits. As shown in FIGS. 1 and 2, the input signal Iin indicates a logic value of "1110" as an example. A specific example of a relationship between the input signal Iin and the applied magnetic flux will be described later.

The first current control line 3 is a control line to which a first excitation current Ix1 is input. The second current control line 4 is a control line to which a second excitation current Ix2 is input. The third current control line 5 is a control line to which a third excitation current Ix3 is input. Each of the first excitation current Ix1, the second excitation current Ix2, and the third excitation current Ix3 serves as a clock signal synchronized with the input signal Iin.

As described above, the clock signal according to the input signal Iin is input to each of the first current control line 3, the second current control line 4, and the third current control line 5.

The hold signal line 6 is a control line to which a hold signal Ihold is input. The hold signal Ihold is a current for holding a value of an output signal output from the shift register 70. Here, as shown in FIG. 2, a magnetic flux is applied to the controlled object 9 when the hold signal Ihold is in a high state.

The shift register 70 is a shift register based on a QFP. In the shift register 70, a shift register element based on the QFP is connected in multiple stages corresponding to the number of bits of the input signal Iin. In the shift register 70, it can also be said that the shift register elements are connected in cascade. In the shift register 70, a circuit configuration of the QFP used as the shift register element is common between a plurality of shift register elements.

Figure 4:
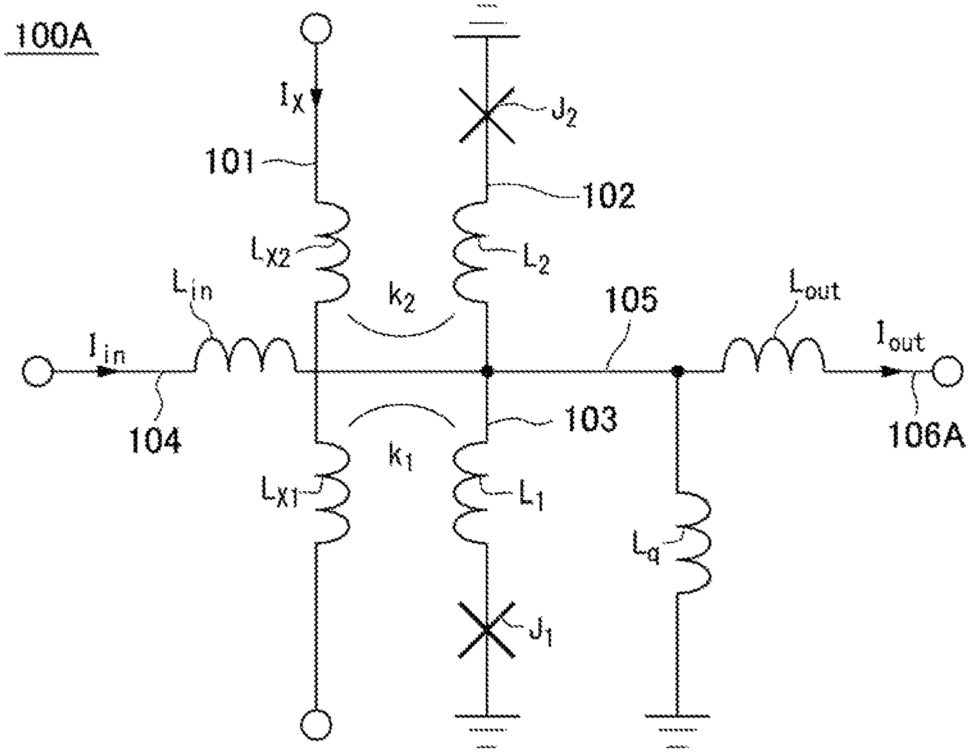
FIG. 4 is a diagram showing an example of a circuit configuration of a QFP used as the shift register element according to the first embodiment of the present invention.
Figures 5, 6:
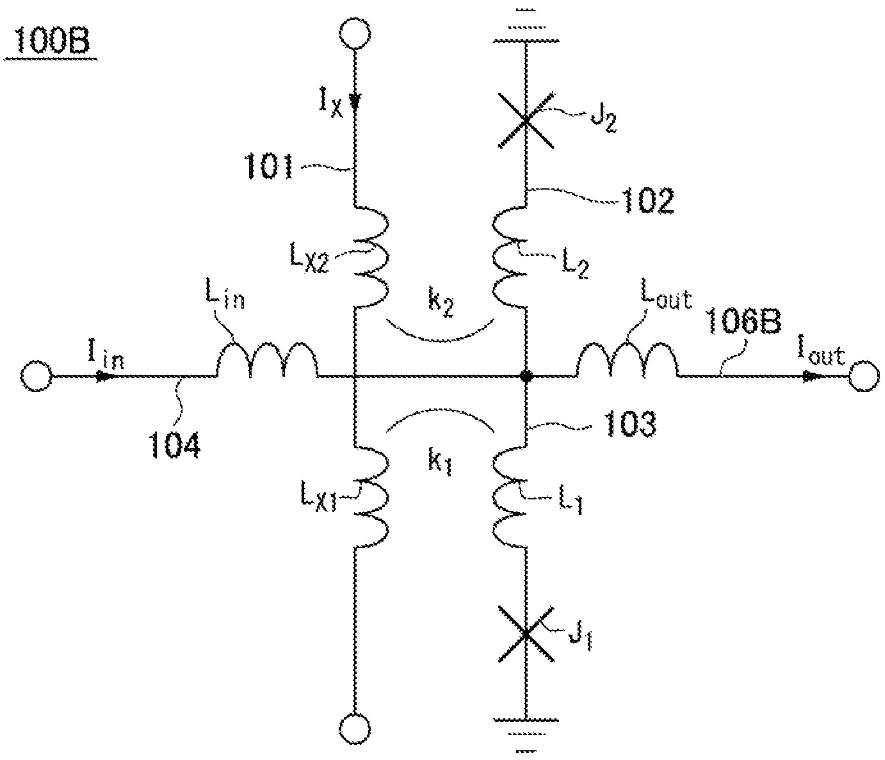
FIG. 5 is a diagram showing an example of a circuit configuration of a QFP used as the shift register element according to the first embodiment of the present invention.
FIG. 6 is a diagram showing an example of a relationship between an input signal and an applied magnetic flux according to the first embodiment of the present invention.

Here, an example of the circuit configuration of the QFP used as the shift register element provided in the shift register 70 shown in FIG. 1 will be described with reference to FIGS. 3 to 5. A circuit configuration of the shift register element provided in the shift register 70 shown in FIG. 1 is, for example, one of circuit configurations of the QFPs shown in FIGS. 3 to 5. Further, the circuit configurations of the QFPs shown in FIGS. 3 to 5 are examples, and the circuit configuration of the shift register element provided in the shift register 70 shown in FIG. 1 may also be a circuit configuration of a QFP other than the circuit configurations of the QFPs shown in FIGS. 3 to 5.

Figure 3:
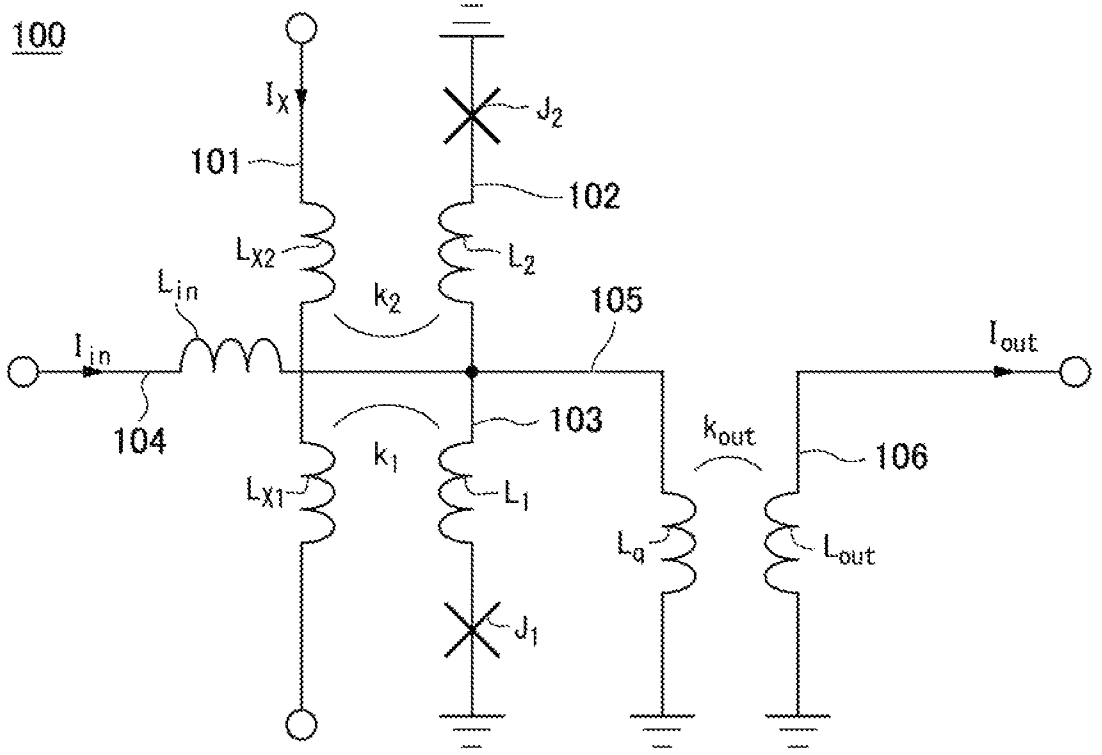
FIG. 3 is a diagram showing an example of a circuit configuration of a QFP used as a shift register element according to the first embodiment of the present invention.

FIG. 3 is a diagram showing an example of a circuit configuration of a QFP 100 used as a shift register element according to the present embodiment. The QFP 100 is driven and clocked by an alternate current bias current Ix. When the alternate current bias current Ix flows through a power supply line 101, a magnetic flux is generated in each of an inductor Lx1 and an inductor Lx2 provided on the power supply line 101.

The inductor Lx1 and an inductor L1 provided in a circuit element 103 are magnetically coupled by a coupling constant k1. The inductor Lx2 and an inductor L2 provided in a circuit element 102 are magnetically coupled by a coupling constant k2. When a magnetic flux is applied to the inductor L1 and the inductor L2, a Josephson junction J1 and a Josephson junction J2, which are a pair of Josephson junctions, determine a logic state according to the input signal Iin flowing through an input signal line 104, and amplify the input signal Iin to generate a signal current. Here, the Josephson junction J1 is provided in the circuit element 103. The Josephson junction J2 is provided in the circuit element 102.

When the generated signal current flows through a signal current line 105, a magnetic flux is generated in the inductor Lq provided in the signal current line 105. The inductor Lq and an inductor Lout that is provided in an output signal line 106 are magnetically coupled by a coupling constant kout. An output signal Iout flows through the output signal line 106 due to a magnetic flux generated in the inductor Lout.

FIG. 4 is a diagram showing an example of a circuit configuration of a QFP 100A used as the shift register element according to the present embodiment. When the QFP 100A (FIG. 4) and the QFP 100 (FIG. 3) are compared, an output signal line 106A is different. Here, other components (the power supply line 101, the circuit element 102, the circuit element 103, the input signal line 104, and the signal current line 105) are the same as those of the QFP 100 (FIG. 3). A description of the same components as those in the QFP 100 (FIG. 3) will be omitted, and in FIG. 4, the description will focus on portions different from the QFP 100 (FIG. 3).

The output signal line 106A is connected to the signal current line 105 on a non-grounded side of the inductor Lq that is provided on the signal current line 105. In other words, the output signal line 106A and the inductor Lq are connected in parallel to the signal current line 105. When the generated signal current flows through the signal current line 105, a part of the signal current flows through the inductor Lq provided in the signal current line 105. The remaining part of the signal current flows through the output signal line 106A as the output signal Iout.

FIG. 5 is a diagram showing an example of a circuit configuration of a QFP 100B used as the shift register element according to the present embodiment. When the QFP 100B (FIG. 5) and the QFP 100A (FIG. 4) are compared, the QFP 100B (FIG. 5) differs in that the signal current line 105 and the inductor Lq provided in the QFP 100A (FIG. 4) are not provided. Here, other components (the power supply line 101, the circuit element 102, the circuit element 103, and the input signal line 104) are the same as those of the QFP 100A (FIG. 4). A description of the same functions as those in the QFP 100A (FIG. 4) will be omitted, and in FIG. 5, the description will focus on portions different from the QFP 100A (FIG. 4).

In the QFP 100B, when a magnetic flux is applied to the inductor L1 and the inductor L2, the Josephson junction J1 and the Josephson junction J2, which are a pair of Josephson junctions, determine a logic state according to the input signal Iin flowing through an input signal line 104, and amplify the input signal Iin to generate the signal current Iout. The generated output signal Iout is output from an output signal line 106B.

Returning to FIG. 1, the description of the configuration of the magnetic flux bias circuit 1 will be continued.

The shift register 70 includes a first shift register element 72-1, a second shift register element 73-1, a third shift register element 74-1, a fourth shift register element 75-1, a first shift register element 72-2, a second shift register element 73-2, a third shift register element 74-2, a fourth shift register element 75-2, a first shift register element 72-3, a second shift register element 73-3, a third shift register element 74-3, a fourth shift register element 75-3, a first shift register element 72-4, a second shift register element 73-4, a third shift register element 74-4, and a fourth shift register element 75-4.

The shift register 70 includes a first shift register element, a second shift register element, a third shift register element, and a fourth shift register element in each of the multiple stages. A set of the first shift register element 72-1, the second shift register element 73-1, the third shift register element 74-1, and the fourth shift register element 75-1 corresponds to one of the stages in which the shift register elements are connected in the shift register 70. A set of the first shift register element 72-2, the second shift register element 73-2, the third shift register element 74-2, and the fourth shift register element 75-2 corresponds to one of the stages in which the shift register elements are connected in the shift register 70. A set of the first shift register element 72-3, the second shift register element 73-3, the third shift register element 74-3, and the fourth shift register element 75-3 corresponds to one of the stages in which the shift register elements are connected in the shift register 70. A set of the first shift register element 72-4, the second shift register element 73-4, the third shift register element 74-4, and the fourth shift register element 75-4 corresponds to one of the stages in which the shift register elements are connected in the shift register 70.

In the shift register 70, in each of the multiple stages, the first shift register element, the second shift register element, and the fourth shift register element are connected in series by the input signal line 2 in an order of the first shift register element, the second shift register element, and the fourth shift register element, and the third shift register element and the fourth shift register element are connected in parallel by the input signal line 2. For example, in a fourth stage counted from the bottom in FIG. 1, the first shift register element 72-4, the second shift register element 73-4, and the fourth shift register element 75-4 are connected in series by the input signal line 2. The third shift register element 74-4 and the fourth shift register element 75-4 are connected in parallel by the input signal line 2.

The fourth shift register element of each stage and the first shift register element of the subsequent stage are connected in series. For example, in FIG. 1, the fourth shift register element 75-4 in the fourth stage counted from the bottom and the first shift register element 72-3 in the third stage counted from the bottom are connected in series.

The third shift register element of each stage is connected in series to the digital/analog converter 71. For example, the third shift register element 74-4 in the fourth stage counting from the bottom and the digital/analog converter 71-4 are connected in series.

In each of the multiple stages, the first shift register elements are connected in series by the first current control line 3, the second shift register elements are connected in series by the second current control line 4, and the third shift register elements and the fourth shift register elements are connected in series by the third current control line 5. In each of the multiple stages, the first excitation current Ix1 serving as a clock signal is input from the first current control line 3 to the first shift register elements, the second excitation current Ix2 serving as a clock signal is input from the second current control line 4 to the second shift register elements, and the third excitation current Ix3 serving as a clock signal is input from the third current control line 5 to the third shift register elements and the fourth shift register elements.

In the shift register 70, the shift register element holds and outputs a value of the input signal when the input clock signal is in a high state. Holding a value of the input signal means outputting a signal in a high state as the output signal when the value of the input signal is in a high state, and outputting a signal in a low state as the output signal when the value of the input signal is in a low state. The shift register element does not output a signal regardless of the value of the input signal when the input clock signal is in a low state. That is, the shift register element functions as a buffer circuit.

For example, the first shift register element 72-4 outputs a signal in a high state as the output signal when the input signal Iin input from the input signal line 2 is in a high state and the first excitation current Ix1 input from the first current control line 3 is in a high state.

In the shift register 70, a value of the input signal Iin input from the input signal line 2 is sequentially propagated while the value is maintained by the shift register elements connected in series. Each of the first excitation current Ix1, the second excitation current Ix2, and the third excitation current Ix3 shown in FIG. 2 becomes a high state at a time synchronized with the input signal Iin so that the value of the input signal Iin is sequentially propagated. Here, as shown in FIG. 2, a time at which the second excitation current Ix2 becomes a high state is delayed by a predetermined time from a time at which the first excitation current Ix1 becomes a high state. Similarly, a time at which the third excitation current Ix3 becomes a high state is delayed by a predetermined time from a time at which the second excitation current Ix2 becomes a high state.

Further, the configuration of the shift register 70 is an example, and a configuration other than the configuration shown in FIG. 1 may also be used. For example, the fourth shift register element may be omitted from the configuration of the shift register 70 shown in FIG. 1. In that case, the output of the third shift register element (for example, the third shift register element 74-4) is branched into two, in which one output is input to the digital/analog converter (for example, the digital/analog converter 71-4), and the other output is input to the first shift register element (for example, the first shift register element 72-3) provided in a stage adjacent to the stage in which the above-described third shift register element is provided among the stages provided in the shift register 70.

The digital/analog converters 71 are provided in a number corresponding to the number of bits of the input signal Iin. The number of stages provided in the shift register 70 described above corresponds to the number of bits of the input signal Iin, in other words, the digital/analog converters 71 are provided to have the same number as the number of stages provided in the shift register 70.

In the present embodiment, in accordance with the input signal Iin being 4 bits, four digital/analog converters 71 including a digital/analog converter 71-1, a digital/analog converter 71-2, a digital/analog converter 71-3, and the digital/analog converter 71-4 are provided. The digital/analog converter 71 is a digital/analog converter based on the QFP.

In the digital/analog converter 71, a circuit configuration of the QFP is common among the digital/analog converters 71-1, the digital/analog converters 71-2, the digital/analog converters 71-3, and digital/analog converters 71-4. Also, the circuit configuration of the QFP of the digital/analog converter 71 is the same as the circuit configuration of the QFP used as the shift register element of the shift register 70 described above. Further, if the QFP of the digital/analog converter 71 functions as a buffer, the circuit configuration thereof may be different from the circuit configuration of the QFP used as the shift register element of the shift register 70.

The digital/analog converter 71-1, the digital/analog converter 71-2, the digital/analog converter 71-3, and the digital/analog converter 71-4 are connected in series by the hold signal line 6. The hold signal Ihold is input from the hold signal line 6 to each of the digital/analog converter 71-1, the digital/analog converter 71-2, the digital/analog converter 71-3, and the digital/analog converter 71-4.

A signal output from the third shift register element provided in each stage of the shift register 70 is input to the digital/analog converter 71 as an input signal. For example, a signal output from the third shift register element 74-4 is input as an input signal to the digital/analog converter 71-4.

If the input hold signal Ihold is in a high state, the digital/analog converter 71 outputs a current as an analog signal according to a value of the input signal. In the following description, the analog signal output by the digital/analog converter 71 is referred to as a QFP output current. The digital/analog converter 71-1, the digital/analog converter 71-2, the digital/analog converter 71-3, and the digital/analog converter 71-4 output a QFP output current Iqfp1, a QFP output current Iqfp2, a QFP output current Iqfp3, and a QFP output current Iqfp4, respectively.

That is, in each of the multiple stages of the shift register 70, the digital/analog converter 71 outputs the analog signal based on a current value output from the third shift register element.

The transformer 8 applies a magnetic flux to the controlled object 9 on the basis of the QFP output current output from the digital/analog converter 71. The transformer 8 is an example of a magnetic flux application unit. The transformers 8 are provided in a number corresponding to the number of bits of the input signal lin. In the present embodiment, in accordance with the input signal Iin being 4 bits, four transformers 8 including a transformer 8-1, a transformer 8-2, a transformer 8-3, and a transformer 8-4 are provided.

Here, the shift register 70 and the digital/analog converter 71 constitute a digital/analog conversion unit 7. The digital/analog conversion unit 7 converts the input signal Iin into an analog signal using a circuit including the QFP on the basis of the input signal Iin input to the input signal line 2, the clock signals respectively input to the first current control line 3, the second current control line 4, and the third current control line 5, and the hold signal Ihold input to the hold signal line 6.

The transformer 8 includes a pair of inductors. When the QFP output current output from the digital/analog converter 71 flows through one of the inductors, a magnetic flux is generated in the other inductor by magnetic coupling. For example, when the QFP output current Iqfp1 output from the digital/analog converter 71-1 flows, a magnetic flux +Φ is generated in the other inductor of the transformer 8-1 by magnetic coupling. The magnetic flux +Φ generated in the transformer 8-1 corresponds to a first bit "1" in a bit string of the input signal lin.

The transformer 8 applies a sum of the magnetic flux generated in each transformer to the controlled object 9 as an applied magnetic flux. The transformer 8 applies the generated magnetic flux to the controlled object 9.

As shown in FIG. 2, a magnetic flux +Φ, a magnetic flux +Φ, a magnetic flux +Φ, and a magnetic flux −Φ are generated in the transformer 8-1, the transformer 8-2, the transformer 8-3, and the transformer 8-4, respectively. The transformer 8 applies a magnetic flux +2Φ to the controlled object 9 as the applied magnetic flux.

Here, a relationship between the input signal Iin and the applied magnetic flux will be described with reference to FIG. 6. FIG. 6 is a diagram showing an example of a relationship between the input signal Iin and the applied magnetic flux according to the present embodiment.

In FIG. 1 or 2 described above, the input signal Iin is represented as a time waveform, and a least significant bit (LSB) of the input is shown at a left end while the most significant bit (MSB) of the input is shown at a right end. On the other hand, in FIG. 6, the input signal Iin is shown using digital values. In the digital values, the LSB of the input signal Iin shown in FIG. 1 or 2 is shown at the right end, and the MSB is shown at the left end.

FIG. 6 shows polarities of the QFP output current Iqfp4, the QFP output current Iqfp3, the QFP output current Iqfp2, and the QFP output current Iqfp1 output from the digital/analog conversion unit 7, and the applied magnetic flux generated by the transformer 8 when the input signal Iin is input to the magnetic flux bias circuit 1.

In the magnetic flux bias circuit 1, the input signal Iin indicates a magnitude and a polarity of the applied magnetic flux using a digital value. In the magnetic flux bias circuit 1, the magnitude and the polarity of the applied magnetic flux are controlled with a resolution according to the number of bits of the input signal Iin. In the magnetic flux bias circuit 1, when the input signal Iin has m bits, it is possible to control the applied magnetic flux of m+1 levels. Being able to control the applied magnetic flux of m+1 levels means being able to control m+1 different magnitudes of the applied magnetic flux including the polarities. In the magnetic flux bias circuit 1, it is possible to control the value of the applied magnetic flux in five ways of −4Φ, −2Φ, 0, 2Φ, and 4Φ by the 4-bit input signal Iin.

As described above, in the magnetic flux bias circuit 1, a total of five control lines including the input signal line 2, the first current control line 3, the second current control line 4, the third current control line 5, and the hold signal line 6 are provided. In the present embodiment, a case in which the number of the controlled objects 9 is one has been described, but in the magnetic flux bias circuit 1, even if the number of the controlled objects 9 is two or more, it is possible to control the applied magnetic flux with the five control lines. If the number of the controlled objects 9 is two or more, patterns of the signals of the input signal Iin input to the input signal line 2, the first excitation current Ix1 input to the first current control line 3, the second excitation current Ix2 input to the second current control line 4, and the third excitation current Ix3 input to the third current control line 5 need to be increased in the number of input bits and the number of required clocks from the patterns shown in FIG. 2. Also, in a case of increasing the resolution of the applied magnetic flux, it is necessary to increase the number of input bits and the number of required clocks from the patterns shown in FIG. 2.

Second Embodiment

Hereinafter, a second embodiment of the present invention will be described in detail with reference to the drawings.

In the first embodiment described above, a case in which the magnetic flux bias circuit has five control lines, and the applied magnetic flux of m+1 levels can be controlled when the input signal Iin has m bits has been described. In the present embodiment, a case in which the magnetic flux bias circuit has five to seven control lines, and the applied magnetic flux of more than m+1 levels can be controlled when the input signal Iin has m bits will be described.

The magnetic flux bias circuit according to the present embodiment is referred to as a magnetic flux bias circuit 1A.

Further, components the same as those in the first embodiment described above will be denoted by the same reference signs, and a description of the same components and operations may be omitted.

Figure 7:
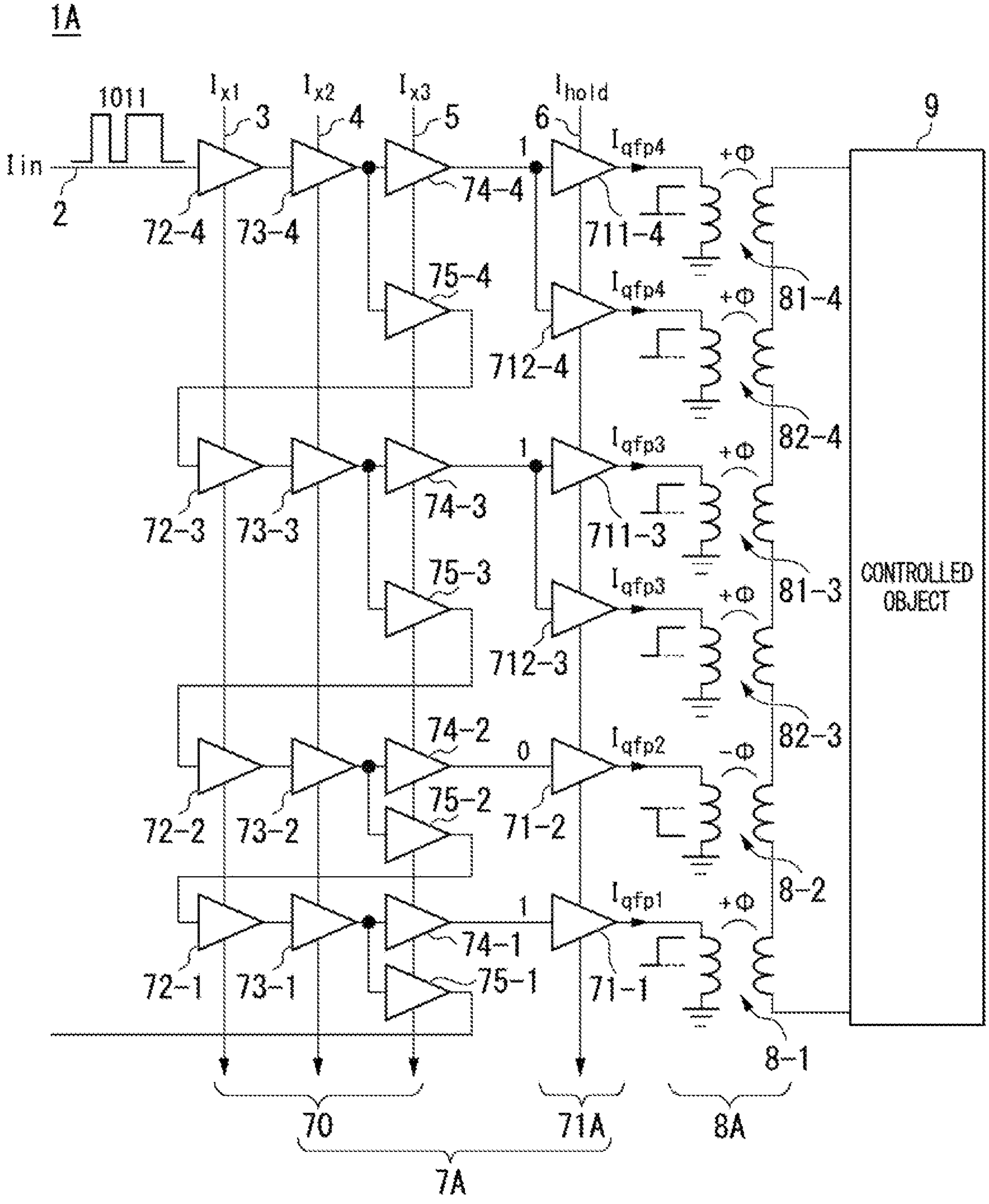
FIG. 7 is a diagram showing an example of a configuration of a magnetic flux bias circuit according to a second embodiment of the present invention.
Figure 8:
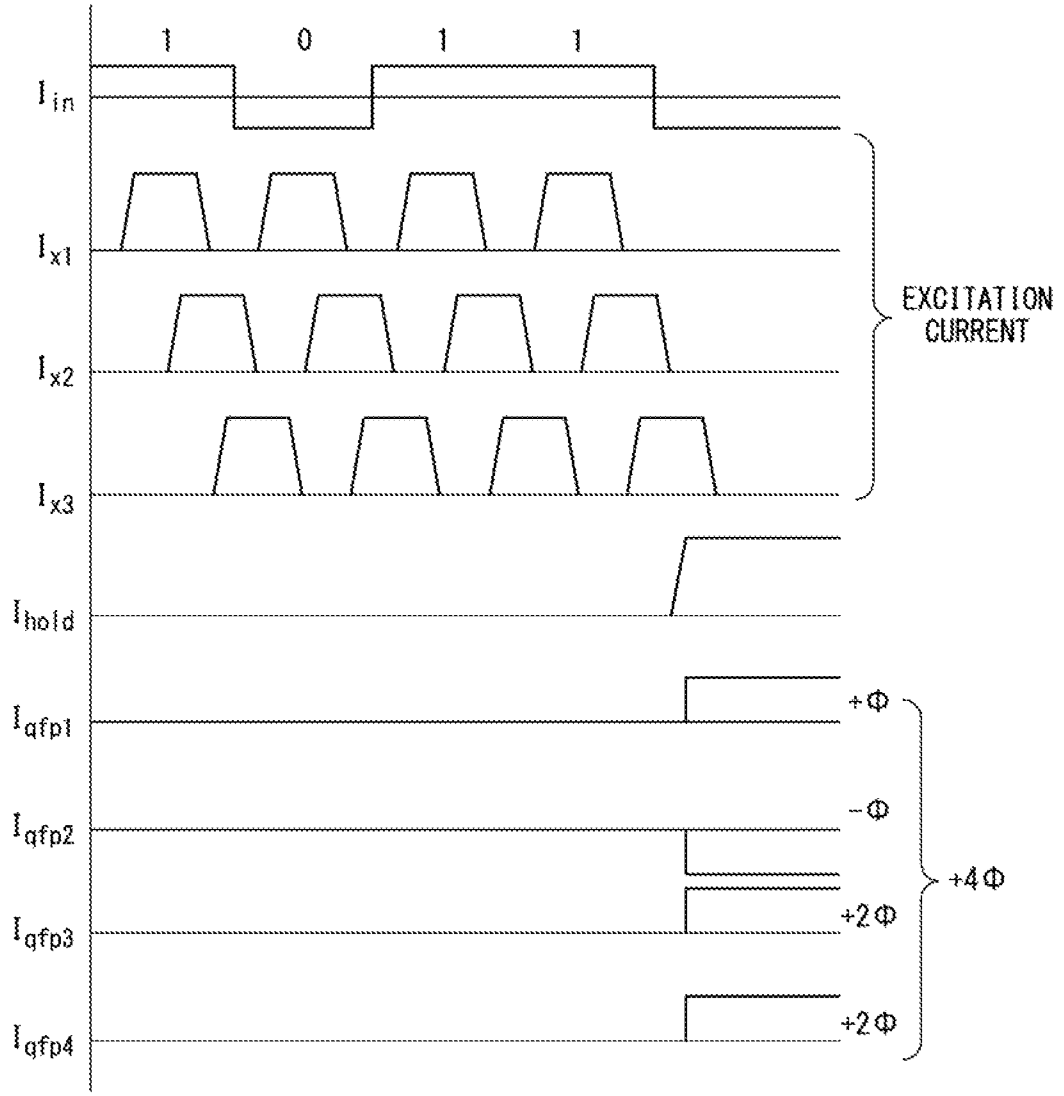
FIG. 8 is a diagram showing an example of various signals flowing through the magnetic flux bias circuit according to the second embodiment of the present invention.

FIG. 7 is a diagram showing an example of a configuration of the magnetic flux bias circuit 1A according to the present embodiment. FIG. 8 is a diagram showing an example of various signals flowing through the magnetic flux bias circuit 1A according to the present embodiment. The magnetic flux bias circuit 1A includes an input signal line 2, a first current control line 3, a second current control line 4, a third current control line 5, a hold signal line 6, a shift register 70, a digital/analog converter 71A, and a transformer 8A. The shift register 70 and the digital/analog converter 71A constitute a digital/analog conversion unit 7A. Further, the configuration of the shift register 70A and the configuration of the digital/analog converter 71A shown in FIG. 7 are examples, and other configurations may also be used.

In the magnetic flux bias circuit 1A, two QFP output currents are associated with one or more bits in a bit string of an input signal lin. For example, in a bit string "1011" of the input signal Iin, one QFP output current is associated with each of bits "1" and "0" included in a first bit string "10," whereas two QFP output currents are associated with each of bits "1" and "1" included in a last two bit strings "11".

Accordingly, the digital/analog converter 71A is provided in a number larger than the number of bits of the input signal Iin. Two digital/analog converters 71A are provided in each of third and fourth stages counted from a bottom in the example shown in FIG. 7.

In the magnetic flux bias circuit 1A, two QFP output currents are associated with each of the third and fourth bits in the bit string of the input signal lin. Accordingly, a digital/analog converter 711-4 and a digital/analog converter 712-4 are provided in the fourth stage. A digital/analog converter 711-3 and a digital/analog converter 712-3 are provided in the third stage.

In the magnetic flux bias circuit 1A, in each of the stages corresponding to the third and fourth bits in the bit string of the input signal Iin, two digital/analog converters are connected in parallel to third shift register elements provided in a corresponding stage of the shift register 70. A signal output from the third shift register element is input to each of the two digital/analog converters as an input signal.

For example, the digital/analog converter 711-4 and the digital/analog converter 712-4 are provided in parallel. A signal output from a third shift register element 74-4 is, as an input signal, input to the digital/analog converter 711-4 and the digital/analog converter 712-4, respectively.

Two digital/analog converters 71A are provided in each of the third stage and the fourth stage, and accordingly two transformers 8A are provided in each of the third and fourth stages. For example, a transformer 81-4 and a transformer 82-4 are provided in the fourth stage. The transformer 81-4 and the transformer 82-4 each generate a magnetic flux +Φ when QFP output currents Iqfp4 output from the digital/analog converter 711-4 and the digital/analog converter 712-4 flow therethrough. Therefore, when the magnetic flux generated by the transformer 81-4 and the magnetic flux generated by the transformer 82-4 are added, the resulting magnetic flux is +2Φ. The magnetic flux of +20 generated in the transformer 81-4 and the transformer 82-4 corresponds to a fourth bit "1" in the bit string of the input signal Iin.

Here, a relationship between the input signal Iin and the applied magnetic flux will be described with reference to FIG. 9. FIG. 9 is a diagram showing an example of a relationship between the input signal Iin and the applied magnetic flux according to the present embodiment.

In FIG. 7 or 8 described above, the input signal Iin is represented as a time waveform, and an LSB of the input is shown at a left end while an MSB is shown at a right end. On the other hand, in FIG. 9, the input signal Iin is shown using digital values. In the digital values, the LSB of the input signal Iin shown in FIG. 7 or 8 is shown at the right end, and the MSB thereof is shown at the left end.

FIG. 9 shows polarities of the QFP output current Iqfp4, a QFP output current Iqfp3, a QFP output current Iqfp2, and ae QFP output current Iqfp1 output from the digital/analog conversion unit 7A, and the applied magnetic flux generated by the transformer 8A when the input signal Iin is input to the magnetic flux bias circuit 1A.

In the magnetic flux bias circuit 1A, the input signal Iin indicates a magnitude and a polarity of the applied magnetic flux using a digital value. In the magnetic flux bias circuit 1A, the magnitude and the polarity of the applied magnetic flux are controlled with a resolution according to the number of bits of the input signal lin. In the magnetic flux bias circuit 1A, when the input signal Iin has m bits, it is possible to control the applied magnetic flux of M levels. Here, the number M is $2^{(m/2+1)}-1$. In the magnetic flux bias circuit 1A, for example, it is possible to control a value of the applied magnetic flux in seven ways of −6Φ, −4Φ, −2Φ, 0, 2Φ, 4Φ, and 6Φ by the 4-bit input signal Iin.

As described above, in the magnetic flux bias circuit 1A, the number of digital/analog converters included in the digital/analog conversion unit 7A is larger than the number of bits of the input signal lin. Also, in the magnetic flux bias circuit 1A, a plurality of digital/analog converters are associated with one or more bits among the bits of the input signal Iin.

As described above, in the magnetic flux bias circuit 1A, two QFP output currents are respectively associated with the third and fourth bits in the bit string of the input signal lin. Accordingly, two signal lines branch from the input signal line 2. The two signal lines include a signal line for inputting a signal from a third shift register element 74-3 to the digital/analog converter 712-3, and a signal line for inputting a signal from the third shift register element 74-4 to the digital/analog converter 712-4.

The magnetic flux bias circuit 1A includes the input signal line 2, the first current control line 3, the second current control line 4, the third current control line 5, and the hold signal line 6. Therefore, the magnetic flux bias circuit 1A has a total of five control lines. In the present embodiment, a case in which the number of the controlled objects 9 is one has been described, but in the magnetic flux bias circuit 1A, even if the number of the controlled objects 9 is two or more, it is possible to control the applied magnetic flux with the five control lines. If the number of the controlled objects 9 is two or more, patterns of the signals of the input signal Iin input to the input signal line 2, a first excitation current Ix1 input to the first current control line 3, a second excitation current Ix2 input to the second current control line 4, and a third excitation current Ix3 input to the third current control line 5 need to be increased in the number of input bits and the number of required clocks from the patterns shown in FIG. 8.

Third Embodiment

In the second embodiment, a case in which the input signal Iin is 4 bits has been described. In the present embodiment, a case in which an input signal Iin has m bits (8 bits as an example) and a hold signal Ihold is three-phase currents will be described.

A magnetic flux bias circuit according to the present embodiment is referred to as a magnetic flux bias circuit 1B.

Further, components the same as those in the first embodiment described above will be denoted by the same reference signs, and a description of the same components and operations may be omitted.

Figure 10:
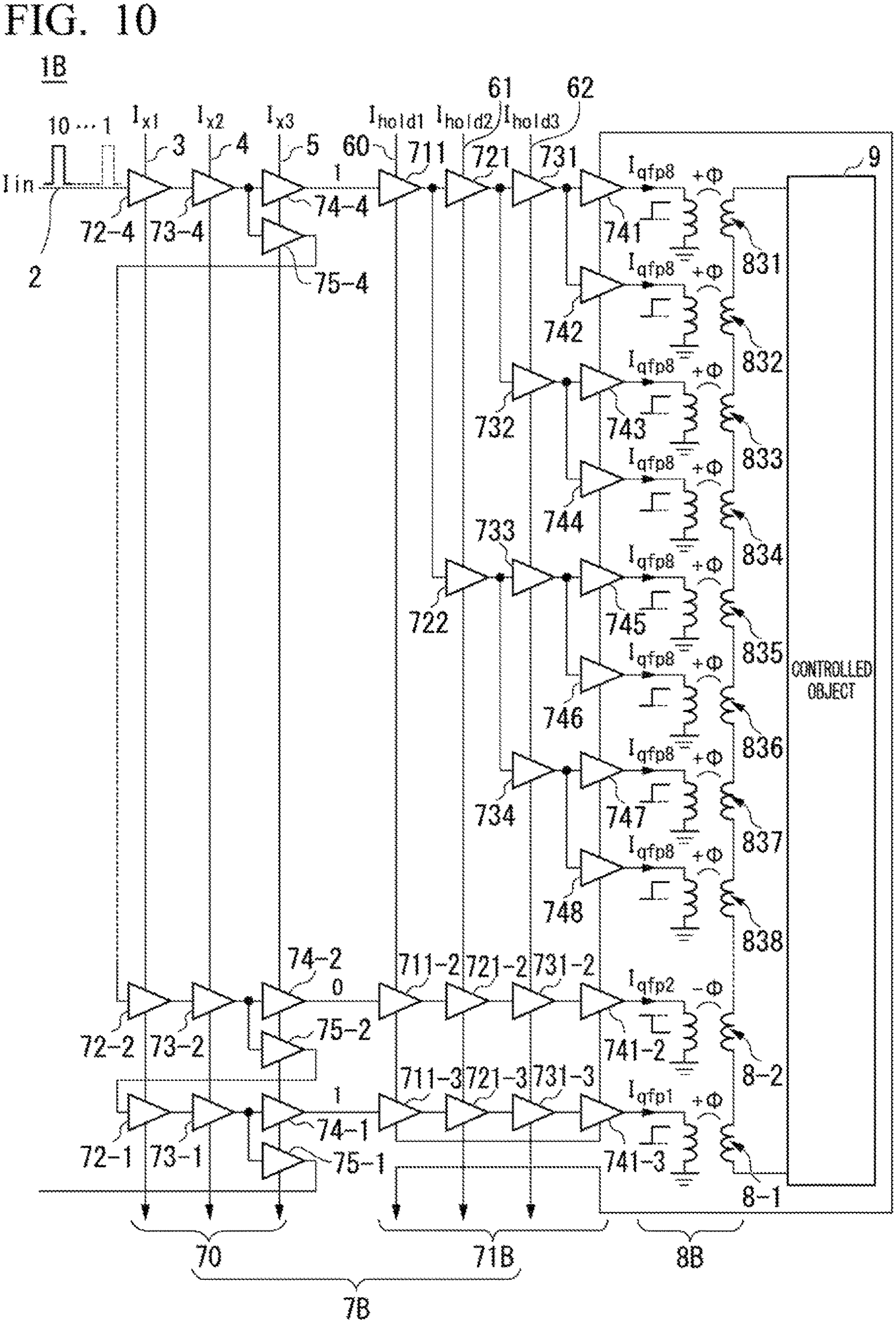
FIG. 10 is a diagram showing an example of a configuration of a magnetic flux bias circuit according to a third embodiment of the present invention.

FIG. 10 is a diagram showing an example of a configuration of the magnetic flux bias circuit 1B according to the present embodiment. The magnetic flux bias circuit 1B includes an input signal line 2, a first current control line 3, a second current control line 4, a third current control line 5, a first hold signal line 60, and a second hold signal line 61, a third hold signal line 62, a shift register 70, a digital/analog converter 71B, and a transformer 8B. The shift register 70 and the digital/analog converter 71B constitute a digital/analog conversion unit 7B. Further, a configuration of the shift register 70 and a configuration of the digital/analog converter 71B shown in FIG. 10 are examples, and other configurations may also be used.

In the magnetic flux bias circuit 1B, the number of bits of the input signal Iin is 8 bits as an example.

Further, in FIG. 10, only configurations of first, second, and eighth stages counted from a bottom of the shift register 70 are shown, and configurations of third to seventh stages are omitted for simplicity.

A first hold signal Ihold1 is input to the first hold signal line 60. A second hold signal Ihold2 is input to the second hold signal line 61. A third hold signal Ihold3 is input to the third hold signal line 62.

Therefore, in the magnetic flux bias circuit 1B, the hold signals are three-phase currents of the first hold signal Ihold1, the second hold signal Ihold2, and the third hold signal Ihold3.

The digital/analog converter 71B includes digital/analog converters 711, 721, 722, 731, 732, 733, 734, 741, 742, 743, 744, 745, 746, 747, 748, 711-2, 721-2, 731-2, 741-2, 711-3, 721-3, 731-3, and 741-3.

The transformer 8B includes transformers 831, 832, 833, 834, 835, 836, 837, 838, a transformer 8-2, and a transformer 8-1.

Here, the digital/analog converters 711, 721, 722, 731, 732, 733, 734, 741, 742, 743, 744, 745, 746, 747, and 748, and the transformers 831, 832, 833, 834, 835, 836, 837, and 838 are included in a configuration of the eighth stage counted from the bottom. The digital/analog converters 711-2, 721-2, 731-2, and 741-2, and the transformer 8-2 are included in a configuration of the second stage counted from the bottom. The digital/analog converters 711-3, 721-3, 731-3, and 741-3, and the transformer 8-1 are included in a configuration of the first stage counted from the bottom.

An output signal from a third shift register element 74-4 and the first hold signal Ihold1 are input to the digital/analog converter 711.

The digital/analog converter 711, the digital/analog converter 711-2, and the digital/analog converter 711-3 are connected in series by the first hold signal line 60 in that order.

In the eighth to seventh stages of the digital/analog converter 71B, one digital/analog converter to which the first hold signal Ihold1 is input includes a digital/analog converter to which an output signal from the third shift register element provided in the shift register 70 is input, and a digital/analog converter to which the output signal is not input. An output from one digital/analog converter to which the first hold signal Ihold1 and the output signal from the third shift register element are input is input to two digital/analog converters connected in parallel to the digital/analog converter described above and to which the second hold signal Ihold2 is input, respectively. The two digital/analog converters to which the second hold signal Ihold2 is input are connected in series by the second hold signal line 61.

For example, an output from the digital/analog converter 711 to which the first hold signal Ihold1 is input is input to the digital/analog converter 721 and the digital/analog converter 722 connected in parallel to the digital/analog converter 711 and to which the second hold signal Ihold2 is input, respectively.

Here, the digital/analog converter 721, the digital/analog converter 722, the digital/analog converter 721-2, and the digital/analog converter 721-3 are connected in series by the second hold signal line 61 in that order.

Further, in the following description, for a first element, a second element and a third element being connected in parallel to the first element as described above is referred to as the second element and the third element being provided to be branched from the first element in some cases. For example, the digital/analog converter 721 and the digital/analog converter 722 are provided to be branched from the digital/analog converter 711.

In the eighth to fifth stages of the digital/analog converter 71B, an output from one digital/analog converter to which the second hold signal Ihold2 is input is input to two digital/analog converters connected in parallel to the digital/analog converter described above and to which the third hold signal Ihold3 is input, respectively. The two digital/analog converters to which the third hold signal Ihold3 is input are connected in series by the third hold signal line 62.

For example, an output from the digital/analog converter 721 to which the second hold signal Ihold2 is input is input to the digital/analog converter 731 and the digital/analog converter 732 connected in parallel to the digital/analog converter 721 and to which the third hold signal Ihold3 is input, respectively.

Here, the digital/analog converter 731, the digital/analog converter 732, the digital/analog converter 733, the digital/analog converter 734, the digital/analog converter 731-2, and the digital/analog converter 731-3 are connected in series by the third hold signal line 62 in that order.

In the eighth to third stages of the digital/analog converter 71B, an output from one digital/analog converter to which the third hold signal Ihold3 is input is input to two digital/analog converters connected in parallel to the digital/analog converter described above, respectively.

For example, an output from the digital/analog converter 731 to which the third hold signal Ihold3 is input is input to the digital/analog converter 741 and the digital/analog converter 742 connected in parallel to the digital/analog converter 731, respectively.

Here, the digital/analog converter 741-3 provided in the first stage counted from the bottom, the digital/analog converter 741-2 provided in the second stage counted from the bottom, and the digital/analog converter 748, the digital/analog converter 747, the digital/analog converter 746, the digital/analog converter 745, the digital/analog converter 744, the digital/analog converter 743, the digital/analog converter 742, and the digital/analog converter 741 which are provided in the eighth stage counted from the bottom are connected in series by the first hold signal line 60 in that order.

As described above, the first hold signal line 60 is used to connect the digital/analog converter 711, the digital/analog converter 711-2, and the digital/analog converter 711-3 in series. On the other hand, in the series connection due to the first hold signal line 60, the digital/analog converter 741-3 is connected to the digital/analog converter 711-3.

Therefore, the first hold signal line 60 is used for both a series connection of the digital/analog converter 711, the digital/analog converter 711-2, and the digital/analog converter 711-3, and a series connection of the digital/analog converters 741, 742, 743, 744, 745, 746, 747, and 748 provided to be branched from the digital/analog converters 731, 732, 733, and 734 connected in series by the third hold signal line 62, 741-2 connected in series to the digital/analog converter 731-2, and 741-3 connected in series to the digital/analog converter 731-3.

That is, in the magnetic flux bias circuit 1B, the first hold signal line 60 is reused for serially connecting the digital/analog converters provided to be branched from each of the plurality of digital/analog converters connected in series by another hold signal line (the third hold signal line 62).

Eight transformers 8B are provided in the eighth stage in accordance with the fact that eight digital/analog converters are provided in parallel in the eighth stage. The transformers 831, 832, 833, 834, 835, 836, 837, and 838 each generate a magnetic flux +Φ when QFP output currents Iqfp8 output from the digital/analog converters 741, 742, 743, 744, 745, 746, 747, and 748 flow therethrough, respectively. Therefore, when the magnetic fluxes generated by the transformers 831, 832, 833, 834, 835, 836, 837, and 838 are added, the resulting magnetic flux is +8Φ. The magnetic flux of +8Φ corresponds to an eighth bit "1" in the bit string of the input signal Iin.

As described above, in the eighth stage, two digital/analog converters connected to the second hold signal line 61 are provided to be branched from the digital/analog converter connected to the first hold signal line 60. Further, two digital/analog converters connected to the third hold signal line 62 are provided to be branched from the digital/analog converter connected to the second hold signal line 61. Further, two digital/analog converters are provided to be branched from the digital/analog converter connected to the third hold signal line 62, and the two digital/analog converters are connected in series by reusing the first hold signal line 60.

A configuration of the seventh stage is the same as the configuration of the eighth stage. Therefore, also in the seventh stage, similarly to the eighth stage, eight digital/analog converters provided to be branched from the digital/analog converter connected to the third hold signal line 62 and eight transformers corresponding to the above-described digital/analog converters are provided in parallel, and a magnetic flux of +8Φ or −8Φ is generated according to a value of the corresponding bit.

Configurations of the sixth and fifth stages are different compared to the eighth and seventh stages in that the digital/analog converter connected to the second hold signal line 61 is not branched from the digital/analog converter connected to the first hold signal line 60. That is, in the configurations of the sixth and fifth stages, the digital/analog converter connected to the second hold signal line 61 is connected in series to the digital/analog converter connected to the first hold signal line 60. In the configurations of the sixth and fifth stages, similarly to the configurations of the eighth and seventh stages, the digital/analog converter connected to the third hold signal line 62 is provided to be branched from the digital/analog converter connected to the second hold signal line 61. In the configurations of the sixth and fifth stages, similarly to the configurations of the eighth and seventh stages, two digital/analog converters are provided to be branched from each of the two digital/analog converters connected to the third hold signal line 62. Four digital/analog converters provided to be branched from the two digital/analog converters connected to the third hold signal line 62 are connected in series by reusing the first hold signal line 60. In each of the sixth and fifth stages, the four digital/analog converters provided to be branched from the digital/analog converter connected to the third hold signal line 62 and four transformers corresponding to the above-described digital/analog converters are provided in parallel, and a magnetic flux of +4Φ or −4Φ is generated according to a value of the corresponding bit.

Configurations of the fourth and third stages are different compared to the sixth and fifth stages in that the digital/analog converter connected to the third hold signal line 62 is not branched from the digital/analog converter connected to the second hold signal line 61. That is, in the configurations of the fourth and third stages, the digital/analog converter connected to the third hold signal line 62 is connected in series to the digital/analog converter connected to the second hold signal line 61. In the configurations of the fourth and third stages, two digital/analog converters are provided to be branched from one digital/analog converter connected to the third hold signal line 62. The two digital/analog converters branched from one digital/analog converter connected to the third hold signal line 62 are connected in series by reusing the first hold signal line 60. In each of the fourth and third stages, the two digital/analog converters provided to be branched from one digital/analog converter connected to the third hold signal line 62 and two transformers respectively corresponding to the above-described digital/analog converters are provided in parallel, and a magnetic flux of +2Φ or −2Φ is generated according to a value of the corresponding bit.

In the magnetic flux bias circuit 1B, an example of a case in which the input signal Iin is 8 bits has been described in the example shown in FIG. 10, but the present invention is not limited thereto. As long as the hold signal has three phases (the first hold signal Ihold1, the second hold signal Ihold2, and the third hold signal Ihold3), the magnetic flux bias circuit 1B can operate in any number of stages by increasing the number of branches even if the number of bits m of the input signal Iin increases. Here, an example of a method of increasing the branches when the number of bits m of the input signal Iin is increased will be described. Further, the method is not limited to the example to be described below.

For example, when the number of bits of the input signal Iin is 10, in addition to the configuration described above, the second hold signal line 61 is reused for serially connecting the digital/analog converters provided in a lowest layer of the branching.

For example, when the number of bits of the input signal Iin is 12, in addition to the configuration for the case of 10 bits, the third hold signal line 62 is reused for serially connecting the digital/analog converters provided in the lowest layer of the branching.

For example, when the number of bits of the input signal Iin is 14, in addition to the configuration for the case of 12 bits, the first hold signal line 60 is reused for serially connecting the digital/analog converters provided in the lowest layer of the branching.

Therefore, in the magnetic flux bias circuit 1B, the number of hold signal lines remains constant at three regardless of the number of the controlled objects 9 and the magnetic flux resolution. The three hold signal lines are the first hold signal line 60, the second hold signal line 61, and the third hold signal line 62 as described above. Therefore, in the magnetic flux bias circuit 1B, the number of control lines is constant regardless of the number of the controlled objects 9 and the magnetic flux resolution.

Modified Example 1 of Third Embodiment

In the present embodiment, a case in which a mutual inductance value is common among the plurality of transformers has been described. Here, a case in which mutual inductance values are different between a plurality of transformers will be described with reference to FIG. 11.

A magnetic flux bias circuit according to the present embodiment is referred to as a magnetic flux bias circuit 1C.

Further, components the same as those in the first embodiment described above will be denoted by the same reference signs, and a description of the same components and operations may be omitted.

Figure 11:
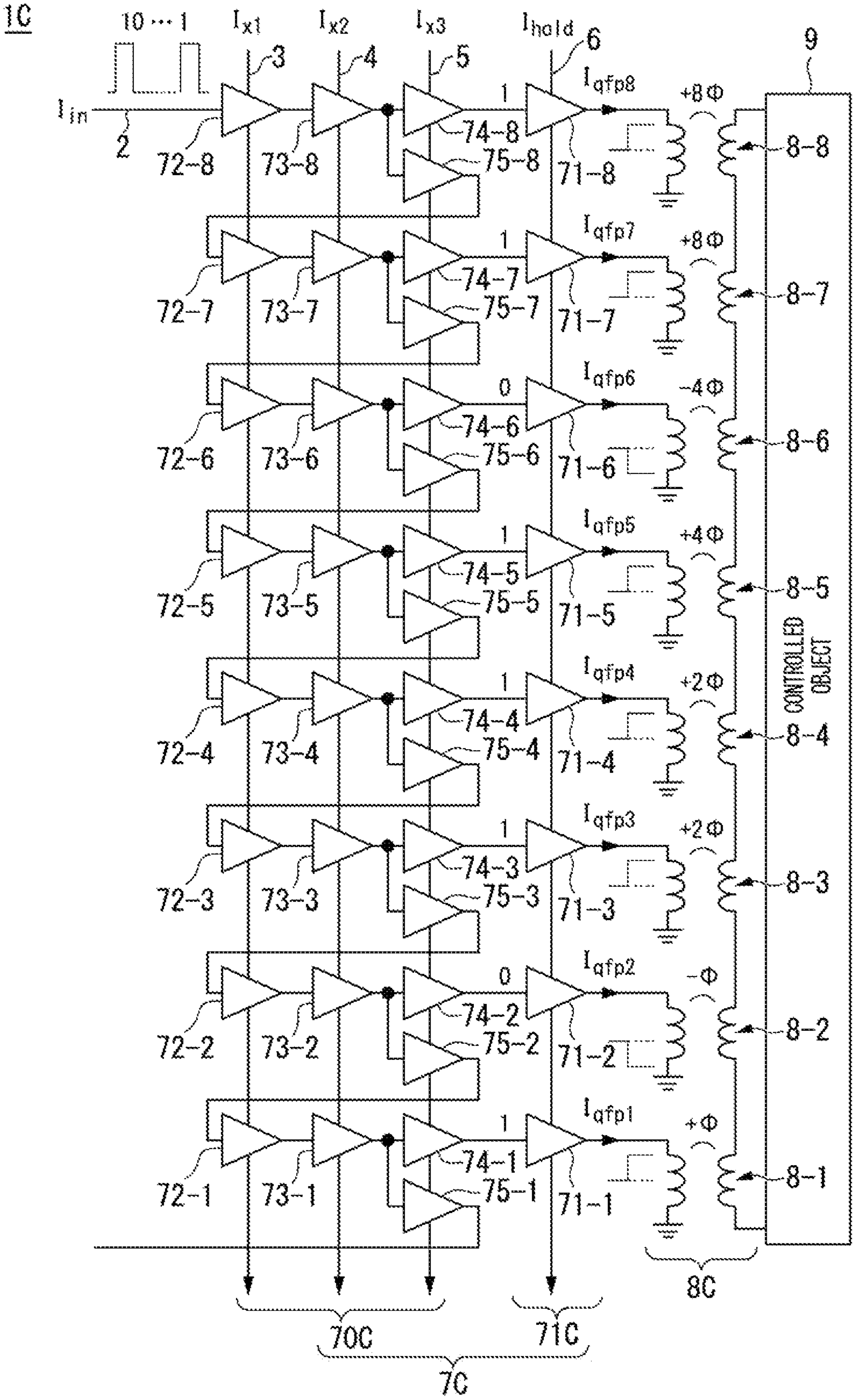
FIG. 11 is a diagram showing an example of a configuration of a magnetic flux bias circuit according to a modified example 1 of the third embodiment of the present invention.

FIG. 11 is a diagram showing an example of a configuration of the magnetic flux bias circuit 1C according to the present modified example. The magnetic flux bias circuit 1C includes the input signal line 2, the first current control line 3, the second current control line 4, the third current control line 5, a hold signal line 6, a shift register 70C, a digital/analog converter 71C, and a transformer 8C. The shift register 70C and the digital/analog converter 71C constitute a digital/analog conversion unit 7C. Further, a configuration of the shift register 70C and a configuration of the digital/analog converter 71C shown in FIG. 11 are examples, and other configurations may also be used.

Here, when the magnetic flux bias circuit 1C (FIG. 11) according to the present modified example is compared with the magnetic flux bias circuit 1 (FIG. 1) according to the first embodiment, the number of stages of the shift register 70C and the number of digital/analog converters 71C provided in the transformer 8C are different. Configurations of the shift register 70C and the transformer 8C in each stage of the magnetic flux bias circuit 1C (FIG. 11) are the same as those in the magnetic flux bias circuit 1 (FIG. 1).

In the magnetic flux bias circuit 1C, the number of bits of the input signal Iin is 8 bits as an example.

In accordance with the input signal Iin being 8 bits, the transformer 8C includes eight transformers including a transformer 8-1, a transformer 8-2, a transformer 8-3, a transformer 8-4, a transformer 8-5, a transformer 8-6, a transformer 8-7, and a transformer 8-8.

In the transformer 8C, mutual inductance values are different between the plurality of transformers. For example, a magnetic flux +Φ or a magnetic flux −Φ is generated in each of the transformer 8-1 and the transformer 8-2. A magnetic flux +2Φ or a magnetic flux −2Φ is generated in each of the transformer 8-3 and the transformer 8-4. A magnetic flux +4Φ or a magnetic flux −4Φ is generated in each of the transformer 8-5 and the transformer 8-6. A magnetic flux of +8Φ or a magnetic flux of −8Φ is generated in each of the transformer 8-7 and the transformer 8-8.

The transformer 8C applies a sum of the magnetic flux generated in each transformer to a controlled object 9 as an applied magnetic flux. In the magnetic flux bias circuit 1C, the mutual inductance values are made different between the plurality of transformers, and values of the applied magnetic fluxes respectively applied by the plurality of transformers are controlled by a bit string indicated by the input signal lin.

Modified Example 2 of Third Embodiment

Here, a case in which a magnetic flux bias circuit applies magnetic fluxes to three controlled objects will be described with reference to FIG. 12.

Figure 12:
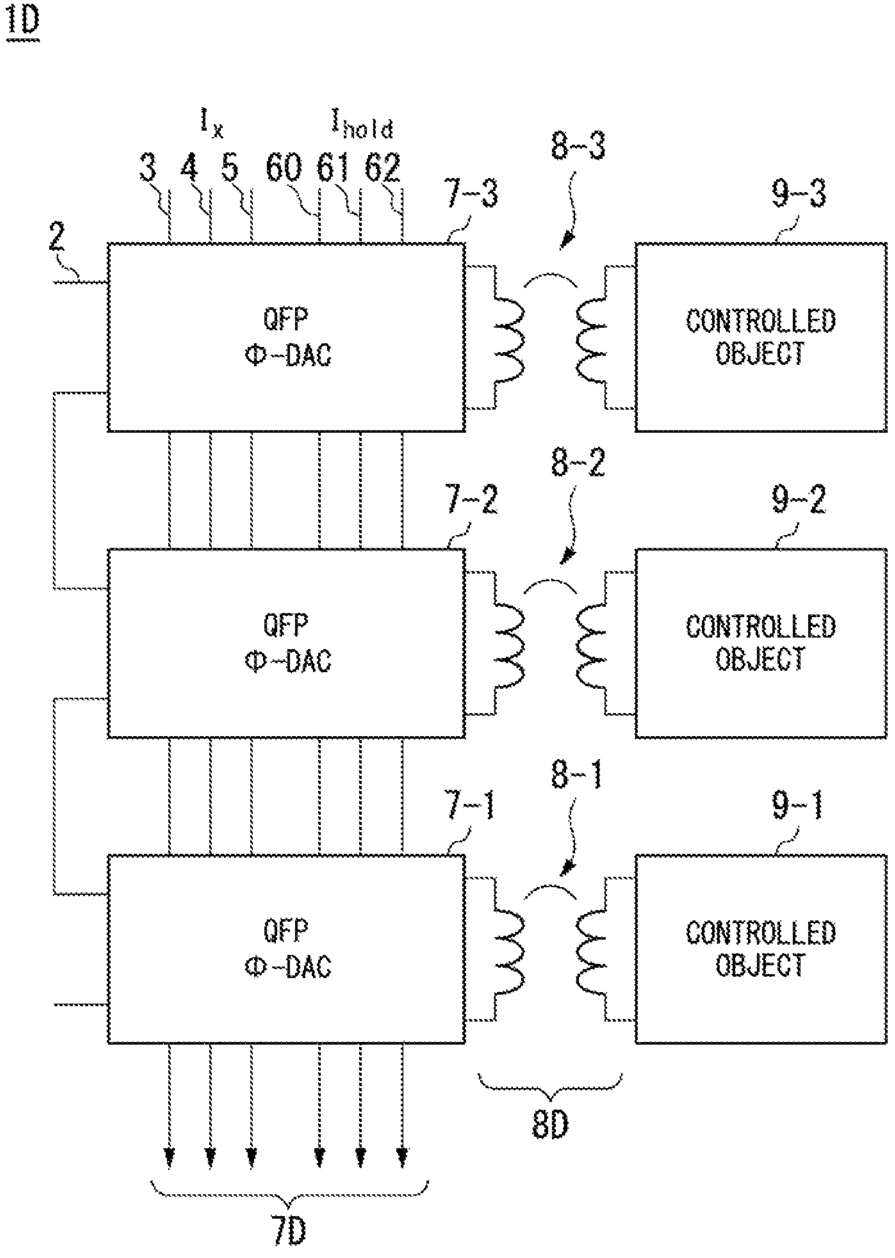
FIG. 12 is a diagram showing an example of a configuration of a magnetic flux bias circuit according to a modified example 2 of the third embodiment of the present invention.

FIG. 12 is a diagram showing an example of a configuration of a magnetic flux bias circuit 1D according to the present modified example. The magnetic flux bias circuit 1D includes the input signal line 2, the first current control line 3, the second current control line 4, the third current control line 5, the first hold signal line 60, the second hold signal line 61, the third hold signal line 62, a digital/analog conversion unit 7D, and a transformer 8D. The digital/analog conversion unit 7D is constituted by a digital/analog conversion unit 7-1, a digital/analog conversion unit 7-2, and a digital/analog conversion unit 7-3. The transformer 8D is constituted by a transformer 8-1, a transformer 8-2, and a transformer 8-3.

A set of the digital/analog conversion unit 7-1 and the transformer 8-1, a set of the digital/analog conversion unit 7-2 and the transformer 8-2, and a set of the digital/analog conversion unit 7-3 and the transformer 8-3 correspond to those of the magnetic flux bias circuit shown in each of FIGS. 1, 7, 10 and 11.

In the magnetic flux bias circuit 1D, configurations of the digital/analog conversion unit 7-1, the digital/analog conversion unit 7-2, and the digital/analog conversion unit 7-3 are used as examples and are the same as the configuration of the digital/analog conversion unit 7B shown in FIG. 10. Further, the number of hold signal lines can be changed from three according to types of the digital/analog conversion unit 7-1, the digital/analog conversion unit 7-2, and the digital/analog conversion unit 7-3.

The input signal line 2, the first current control line 3, the second current control line 4, the third current control line 5, the first hold signal line 60, the second hold signal line 61, and the third hold signal line 62 connects the digital/analog conversion unit 7-1, the digital/analog conversion unit 7-2, and the digital/analog conversion unit 7-3 in series. That is, the input signal line 2, the first current control line 3, the second current control line 4, the third current control line 5, the first hold signal line 60, the second hold signal line 61, and the third hold signal line 62 are commonly used for three digital/analog conversion units including the digital/analog conversion unit 7-1, the digital/analog conversion unit 7-2, and the digital/analog conversion unit 7-3.

The transformer 8-1, the transformer 8-2, and the transformer 8-3 apply applied magnetic fluxes to a controlled object 9-1, a controlled object 9-2, and a controlled object 9-3, respectively, on the basis of analog signals output from each of the digital/analog conversion unit 7-1, the digital/analog conversion unit 7-2, and the digital/analog conversion unit 7-3. The controlled object 9-1, the controlled object 9-2, and the controlled object 9-3 correspond to the controlled object 9 shown in FIGS. 1, 7, 10, and 11, respectively.

In the magnetic flux bias circuit 1D, even when the number of controlled objects is four or more, as in the configuration shown in FIG. 12, magnetic fluxes can be applied to the four or more controlled objects by increasing the number of the digital/analog conversion units and the transformers connected in series with respect to the control lines. Therefore, in the magnetic flux bias circuit 1D, the number of the control lines is constant regardless of the number of the controlled objects and a magnetic flux resolution. Further, if the number of the controlled objects or a resolution of the applied magnetic flux are increased, it is necessary to increase the number of input bits and the number of clocks.

Fourth Embodiment

In each of the embodiments described above, an example of a case in which the QFP is provided as the digital/analog conversion unit has been described. In the present embodiment, a case in which a QFP is used in combination with a single flux quantum (SFQ) circuit as a digital/analog conversion unit will be described.

In an SFQ circuit, information is represented by a flux quantum accumulated within a superconducting loop. The flux quantum propagates within a superconducting loop via a Josephson junction, and a voltage pulse is generated across both ends of the Josephson junction when the flux quantum passes through the Josephson junction in the process of the propagation.

It is known that an SFQ circuit has no direct current resistance and low power consumption because it uses superconducting elements. In the SFQ circuit, power consumption per gate is about 10 µW. Also, in the SFQ circuit, an ultra-high speed operation with a clock frequency of about 100 GHz is possible. Further, the values of the power consumption and the clock frequency of the SFQ circuit described above are examples, and these values may vary according to circuit parameters and types of circuit.

There are various logics in the SFQ circuit, and any of them may be used. Logics of the SFQ circuit includes, for example, Rapid single-flux-quantum (RSFQ), Low-voltage RSFQ (LV-RSFQ), Energy-efficient RSFQ (ERSFQ), Energy-efficient SFQ (eSFQ), Reciprocal quantum logic (RQL), Flux shuttle, and the like. Any of the logics may be used in the SFQ circuit to be described below.

A magnetic flux bias circuit according to the present embodiment is referred to as a magnetic flux bias circuit 1E.

Further, components the same as those in each of the embodiments described above will be denoted by the same reference signs, and a description of the same components and operations may be omitted.

Figure 13:
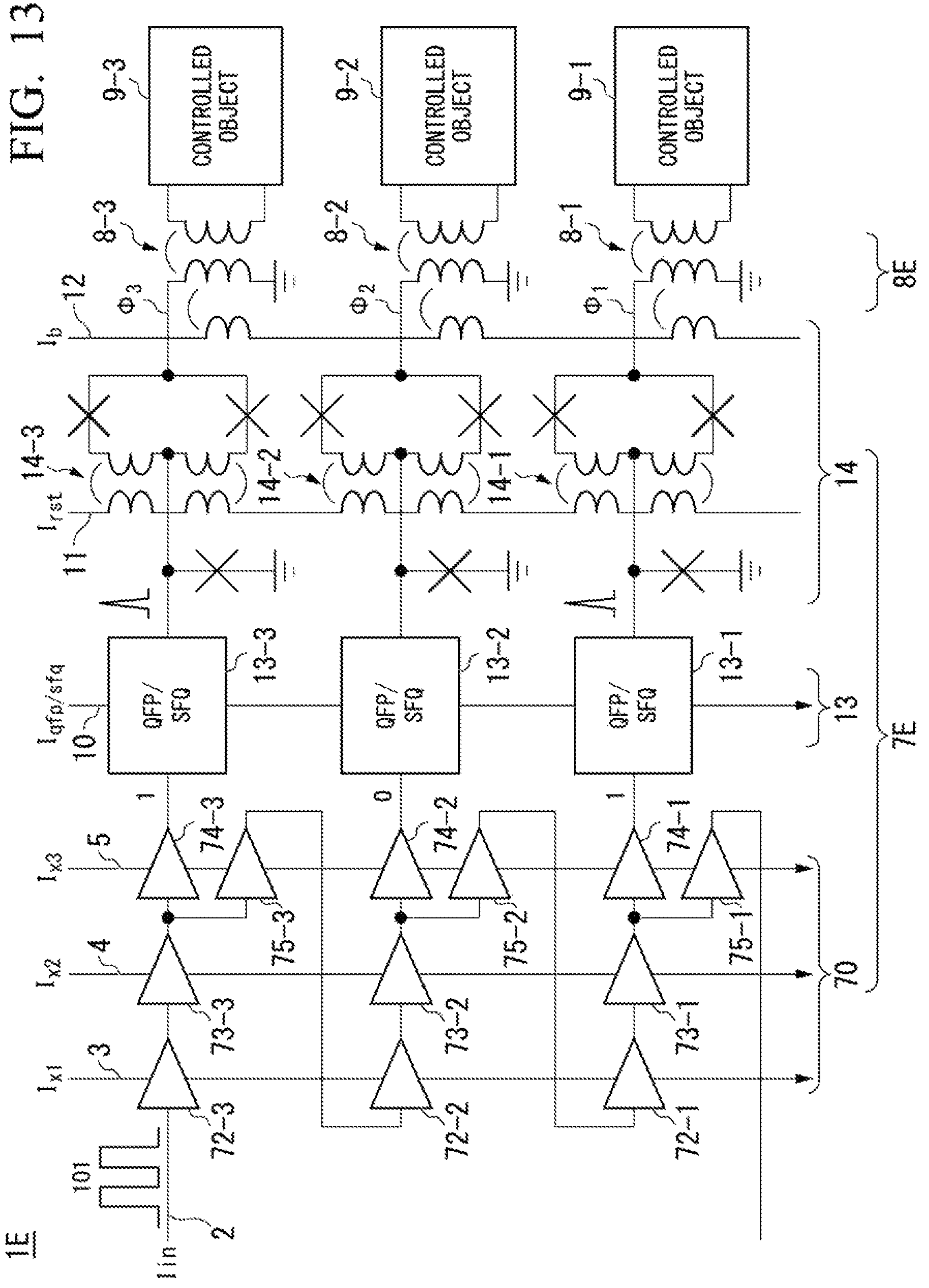
FIG. 13 is a diagram showing an example of a configuration of a magnetic flux bias circuit according to a fourth embodiment of the present invention.
Figure 14:
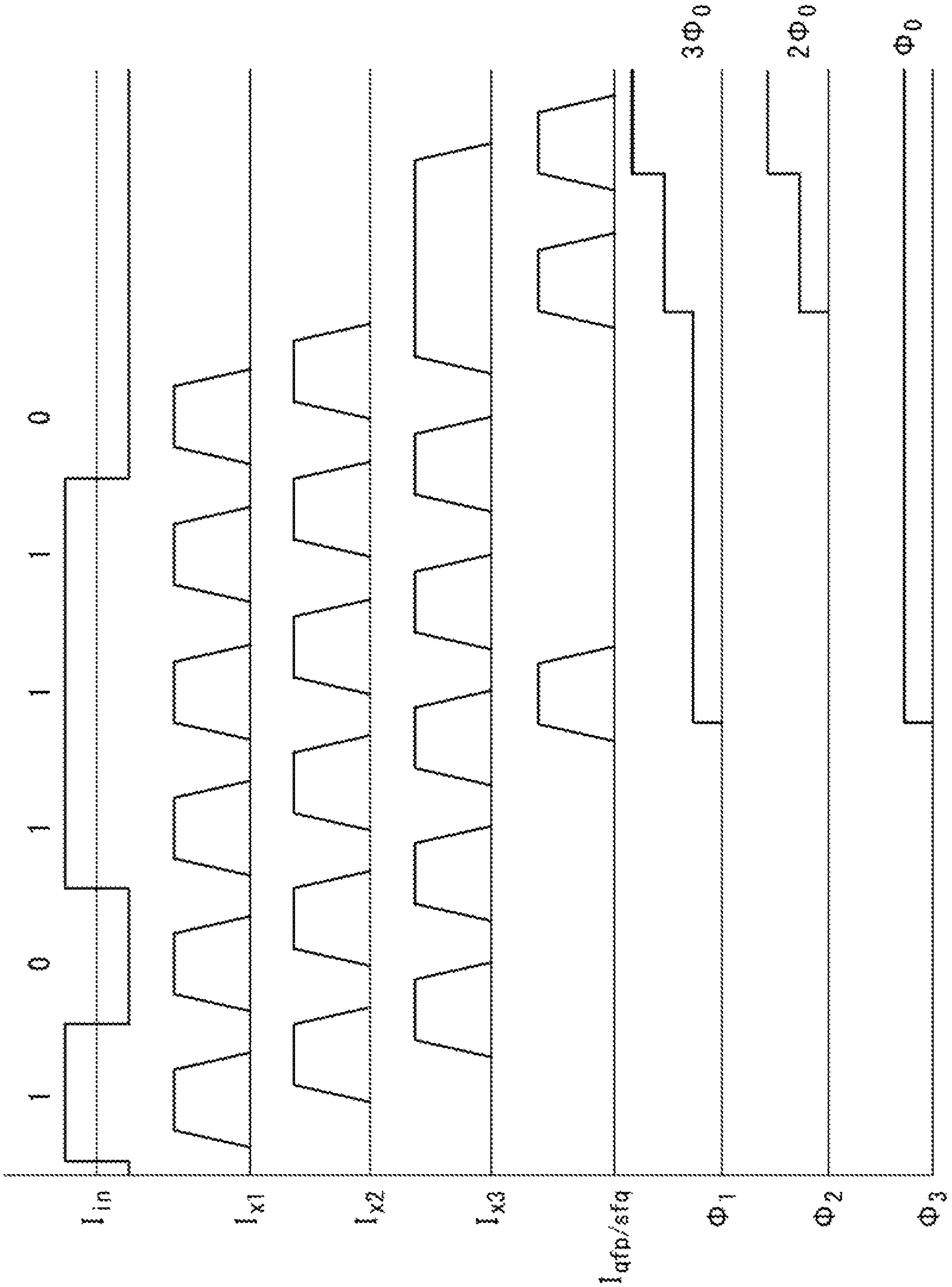
FIG. 14 is a diagram showing an example of various signals flowing through the magnetic flux bias circuit according to the fourth embodiment of the present invention.

FIG. 13 is a diagram showing an example of a configuration of the magnetic flux bias circuit 1E according to the present embodiment. FIG. 14 is a diagram showing an example of various signals flowing through the magnetic flux bias circuit 1E according to the present embodiment.

The magnetic flux bias circuit 1E includes an input signal line 2, a first current control line 3, a second current control line 4, a third current control line 5, an interface control line 10, a reset signal line 11, a bias signal line 12, a shift register 70, a QFP/SFQ interface 13, an SFQ digital/analog converter 14, and a transformer 8E. The shift register 70, the QFP/SFQ interface 13, and the SFQ digital/analog converter 14 constitute a digital/analog conversion unit 7E.

The magnetic flux bias circuit 1E applies a magnetic flux to each of three controlled objects including a controlled object 9-1, a controlled object 9-2, and a controlled object 9-3. Magnitudes of the magnetic fluxes applied to the controlled object 9-1, the controlled object 9-2, and the controlled object 9-3 can be made different from each other. An input signal Iin of three or more bits is input to the input signal line 2.

The interface control line 10 is a control line to which an interface excitation current Iqfp/sfq is input. The interface excitation current Iqfp/sfq is a current for driving the QFP/SFQ interface 13 and adding a flux quantum to the SFQ digital/analog converter 14 according to an input.

The reset signal line 11 is a control line to which a reset signal Irst is input. The reset signal Irst is a current for resetting the flux quantum held by the SFQ digital/analog converter 14.

The bias signal line 12 is a control line to which a bias signal Ib is input. The bias signal Ib is a current for biasing the SFQ digital/analog converter 14.

The QFP/SFQ interface 13 is a circuit for connecting the shift register 70 formed of QFPs and the SFQ digital/analog converter 14 that stores the flux quantum. A current signal is output from the QFP circuit, whereas a voltage pulse signal is input to the SFQ circuit. The QFP/SFQ interface 13 inputs a voltage pulse signal to the SFQ digital/analog converter 14 to add the flux quantum according to the current signal output from the shift register 70 which is a QFP. The QFP/SFQ interface 13 is a circuit including a superconducting element and having a configuration of the QFP.

Here, an example of a circuit configuration of the QFP/SFQ interface 13 shown in FIG. 13 will be described with reference to FIGS. 15 and 16. A circuit configuration of the QFP/SFQ interface 13 shown in FIG. 13 is, for example, either a circuit configuration of the QFP/SFQ interface shown in FIG. 15 or 16. Further, the circuit configurations of the QFP/SFQ interface shown in FIGS. 15 and 16 are examples, and the circuit configuration of the QFP/SFQ interface 13 shown in FIG. 13 may be a QFP/SFQ interface circuit configuration other than the QFP/SFQ interface circuit configuration shown in FIG. 15 or FIG. 16.

Figure 15:
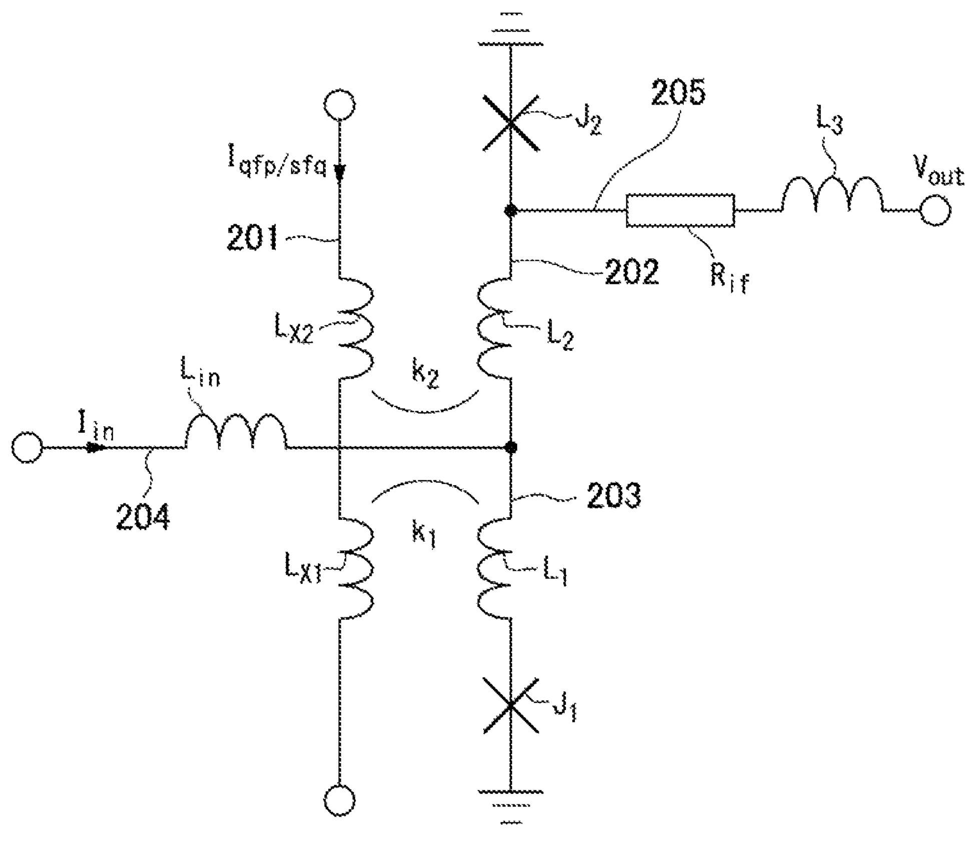
FIG. 15 is a diagram showing an example of a QFP/SFQ interface which is a circuit configuration of a QFP/SFQ interface according to the fourth embodiment of the present invention.
Figure 16:
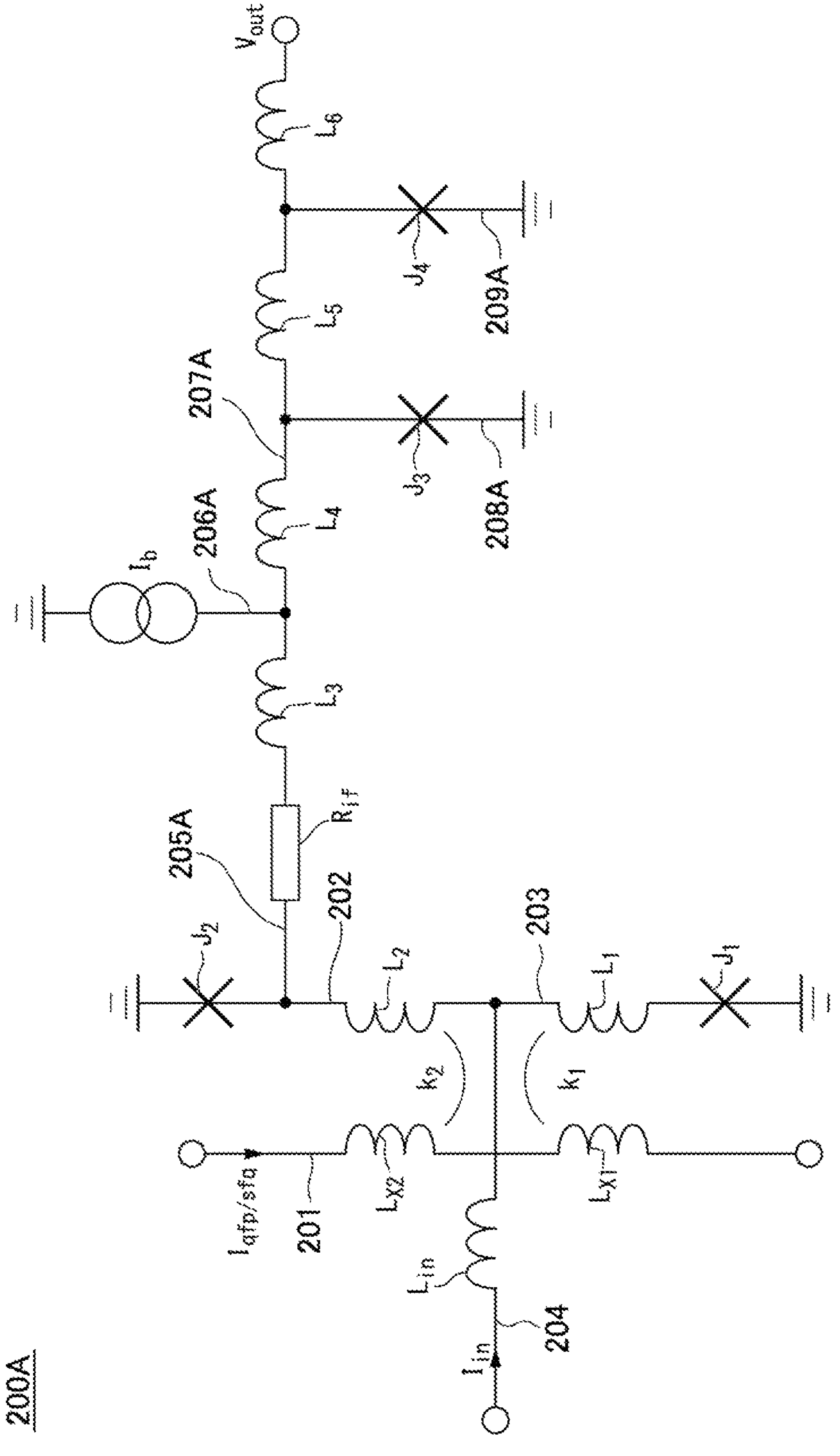
FIG. 16 is a diagram showing an example of a QFP/SFQ interface which is a circuit configuration of the QFP/SFQ interface according to the fourth embodiment of the present invention.

FIG. 15 is a diagram showing an example of a QFP/SFQ interface 200 which is a circuit configuration of the QFP/SFQ interface 13 according to the present embodiment. The QFP/SFQ interface 200 is driven and clocked by the interface excitation current Iqfp/sfq. When the interface excitation current Iqfp/sfq flows through a power supply line 201, a magnetic flux is generated in each of an inductor Lx1 and an inductor Lx2 provided on the power supply line 201.

The inductor Lx1 and an inductor L1 which is provided in a circuit element 203 are magnetically coupled by a coupling constant k1. The inductor Lx2 and an inductor L2 which is provided in a circuit element 202 are magnetically coupled by a coupling constant k2. When a magnetic flux is applied to the inductor L1 and the inductor L2, a Josephson junction J1 and a Josephson junction J2, which are a pair of Josephson junctions, determine a logic state according to the input signal Iin flowing through an input signal line 204 and converts the input signal Iin into a voltage pulse signal Vout. Here, the Josephson junction J1 is provided in the circuit element 203. The Josephson junction J2 is provided in the circuit element 202.

When the input signal Iin is positive (logic state "1"), the Josephson junction J2 switches to generate a voltage pulse, and the voltage pulse signal Vout is output to an output end of an output signal line 205. On the other hand, when the input signal Iin is negative (logic state "0"), the Josephson junction J1 switches, and the voltage pulse signal Vout is not output to the output end of the output signal line 205. In this way, the input signal Iin is converted into the voltage pulse signal Vout in the QFP/SFQ interface 200. Here, the voltage pulse generated by the switching of the Josephson junction is output as the voltage pulse signal Vout from the output end of the output signal line 205 via a register Rif and an inductor L3.

FIG. 16 is a diagram showing an example of a QFP/SFQ interface 200A which is a circuit configuration of the QFP/SFQ interface 13 according to the present embodiment. When the QFP/SFQ interface 200A (FIG. 16) and the QFP/SFQ interface 200 (FIG. 15) are compared, a signal current line 205A, a bias current line 206A, a circuit element 207A, a circuit element 208A, and a circuit element 209A are different. The bias current line 206A, the circuit element 207A, the circuit element 208A, and the circuit element 209A amplify the voltage pulse signal at the QFP/SFQ interface 200 (FIG. 15). Here, other components (the power supply line 201, the circuit element 202, the circuit element 203, and the input signal line 204) are the same as those in the QFP/SFQ interface 200 (FIG. 15). A description of the same components as those in the QFP/SFQ interface 200 (FIG. 15) will be omitted, and in FIG. 16, the description will focus on portions different from the QFP/SFQ interface 200 (FIG. 15).

The voltage pulse generated via the Josephson junction J2 is converted into a current by the register Rif and the inductor L3 provided in the signal current line 205A and output to the circuit element 207A.

The circuit element 207A includes an inductor LA, an inductor L5, and an inductor L6. The circuit element 208A including a Josephson junction J3 is connected between the inductor L4 and the inductor L5. The circuit element 209A including a Josephson junction J4 is connected between the inductor L5 and the inductor L6.

When a current from the signal current line 205A is input to the circuit element 207A, a flux quantum propagates within a superconducting loop via the Josephson junctions J3 and J4, and a voltage pulse is generated across both ends of the Josephson junction when the flux quantum passes through the Josephson junctions in the process of the propagation. The voltage pulse signal Vout generated across both ends of the Josephson junction J4 is output as an output signal.

Returning to FIG. 13, the description of the configuration of the magnetic flux bias circuit 1E will be continued.

The QFP/SFQ interfaces 13 is provided in a number corresponding to the number of the controlled objects 9. The magnetic flux bias circuit 1E includes three QFP/SFQ interfaces including a QFP/SFQ interface 13-1, a QFP/SFQ interface 13-2, and a QFP/SFQ interface 13-3.

The SFQ digital/analog converter 14 holds the flux quantum within a superconducting loop on the basis of the voltage pulse input from the QFP/SFQ interface 13. The SFQ digital/analog converter 14 is provided in a number corresponding to the number of the controlled objects 9. The SFQ digital/analog converter 14 includes three SFQ digital/analog converters including an SFQ digital/analog converter 14-1, an SFQ digital/analog converter 14-2, and an SFQ digital/analog converter 14-3.

Each of the SFQ digital/analog converter 14-1, the SFQ digital/analog converter 14-2, and the SFQ digital/analog converter 14-3 holds the flux quantum within the superconducting loop on the basis of the voltage pulse output from each of the QFP/SFQ interface 13-1, the QFP/SFQ interface 13-2, and the QFP/SFQ interface 13-3. Here, as shown in FIG. 14, the SFQ digital/analog converter 14-1, the SFQ digital/analog converter 14-2, and the SFQ digital/analog converter 14-3 accumulate the flux quantum according to the input signal Iin when the interface excitation current Iqfp/sfq is in a high state. Magnetic fluxes Φ1, Φ2, and Φ3 represent magnetic fluxes stored in the SFQ digital/analog converter 14-1, the SFQ digital/analog converter 14-2, and the SFQ digital/analog converter 14-3, respectively. Magnitudes of the magnetic fluxes Φ1, Φ2, and Φ3 are Φ0, 2Φ0, and 3Φ0, respectively, as an example as shown in FIG. 14. Φ0 indicates a flux quantum. That is, magnitudes of the fluxes Φ1, Φ2, and Φ3 are, respectively, one, two, and three times the magnitude of the flux quantum indicated by Φ0.

The transformer 8E is provided in a number corresponding to the number of the controlled objects 9. The transformer 8E includes three transformers including a transformer 8-1, a transformer 8-2, and a transformer 8-3. The transformer 8-1, the transformer 8-2, and the transformer 8-3 apply the magnetic flux to the controlled object 9-1, the controlled object 9-2, and the controlled object 9-3, respectively, on the basis of the magnetic fluxes Φ1, Φ2, and Φ3 held by each of the SFQ digital/analog converter 14-1, the SFQ digital/analog converter 14-2, and the SFQ digital/analog converter 14-3. The transformer 8-1 applies the applied magnetic flux to the controlled object 9-1. The transformer 8-2 applies the applied magnetic flux to the controlled object 9-2. The transformer 8-3 applies the applied magnetic flux to the controlled object 9-3. Magnitudes of the applied magnetic fluxes applied by the transformer 8-1, the transformer 8-2, and the transformers 8-3 respectively correspond to magnitudes of the magnetic fluxes Φ1, Φ2, and Φ3 accumulated in each of the SFQ digital/analog converter 14-1, the SFQ digital/analog converter 14-2, and SFQ digital/analog converter 14-3.

In the magnetic flux bias circuit 1E, the number of control lines is seven regardless of the number of the controlled objects 9. In the magnetic flux bias circuit 1E, the number of junctions does not change regardless of a resolution of the applied magnetic flux.

In the magnetic flux bias circuit 1E, since the number of control lines is seven regardless of the number of controlled objects, even if the number of controlled objects increases, an increase in the number of control lines (the number of cables) can be suppressed.

Figure 17:
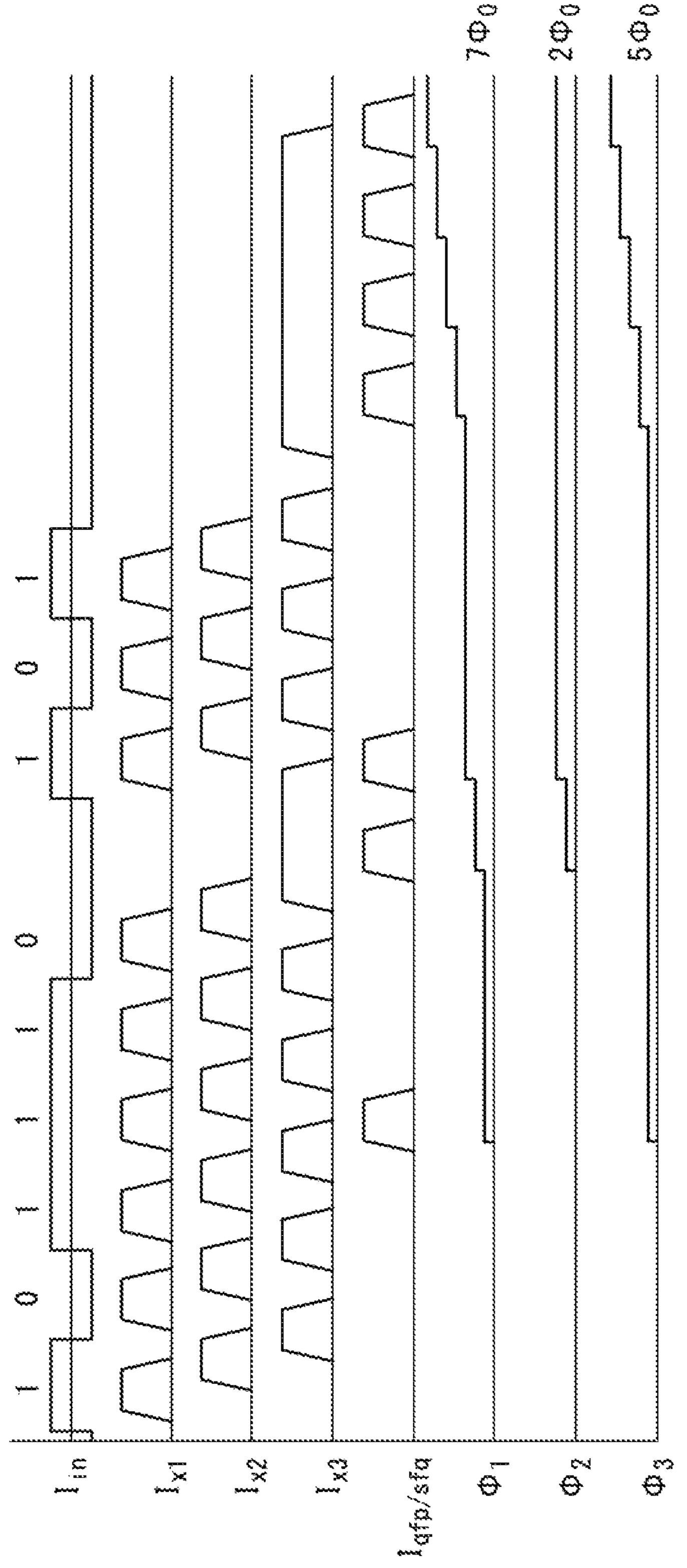
FIG. 17 is a diagram showing an example of various signals flowing through the magnetic flux bias circuit according to the fourth embodiment of the present invention.

Here, a case in which the number of bits of the input signal Iin is larger than that of the example of FIG. 14 will be described with reference to FIG. 17. FIG. 17 is a diagram showing an example of various signals flowing through the magnetic flux bias circuit 1E according to the present embodiment. It is assumed that the number of controlled objects is N, and the resolution of the applied magnetic flux is M levels.

As shown in FIG. 17, in the magnetic flux bias circuit 1E, each time a 3-bit input signal among the input signal Iin having the number of bits larger than three bits is input to the shift register 70, the number of times the interface excitation current Iqfp/sfq is switched to a high state is increased according to powers of 2 such as once, twice, and four times. As a result, for all the SFQ digital/analog converters to which "1" is input as an input among the SFQ digital/analog converters 14, one or more flux quanta are concurrently added one after the other. Therefore, in the magnetic flux bias circuit 1E, even when the number N of controlled objects or the magnetic flux resolution M is large, it is possible to control the applied magnetic flux with steps at most about (on the order of) N log M+M.

Figure 18:
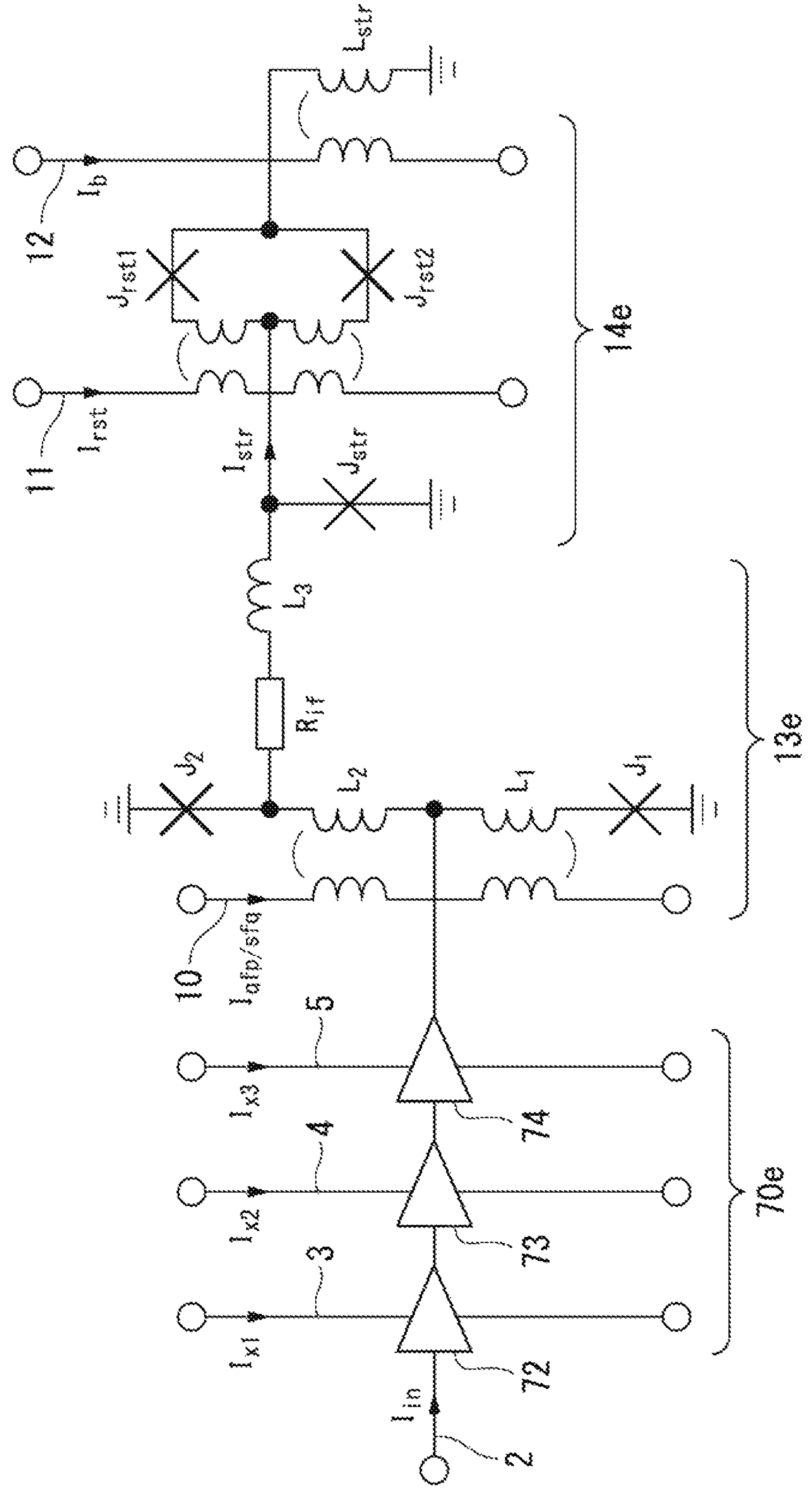
FIG. 18 is a diagram showing an example of a configuration of a magnetic flux bias circuit used for a simulation according to the fourth embodiment of the present invention.

Here, a simulation using a magnetic flux bias circuit when an SFQ circuit is combined with a QFP as a digital/analog converter will be described with reference to FIGS. 18 and 19. FIG. 18 is a diagram showing an example of a configuration of a magnetic flux bias circuit 1*e* used for a simulation according to the present embodiment.

Figure 19:
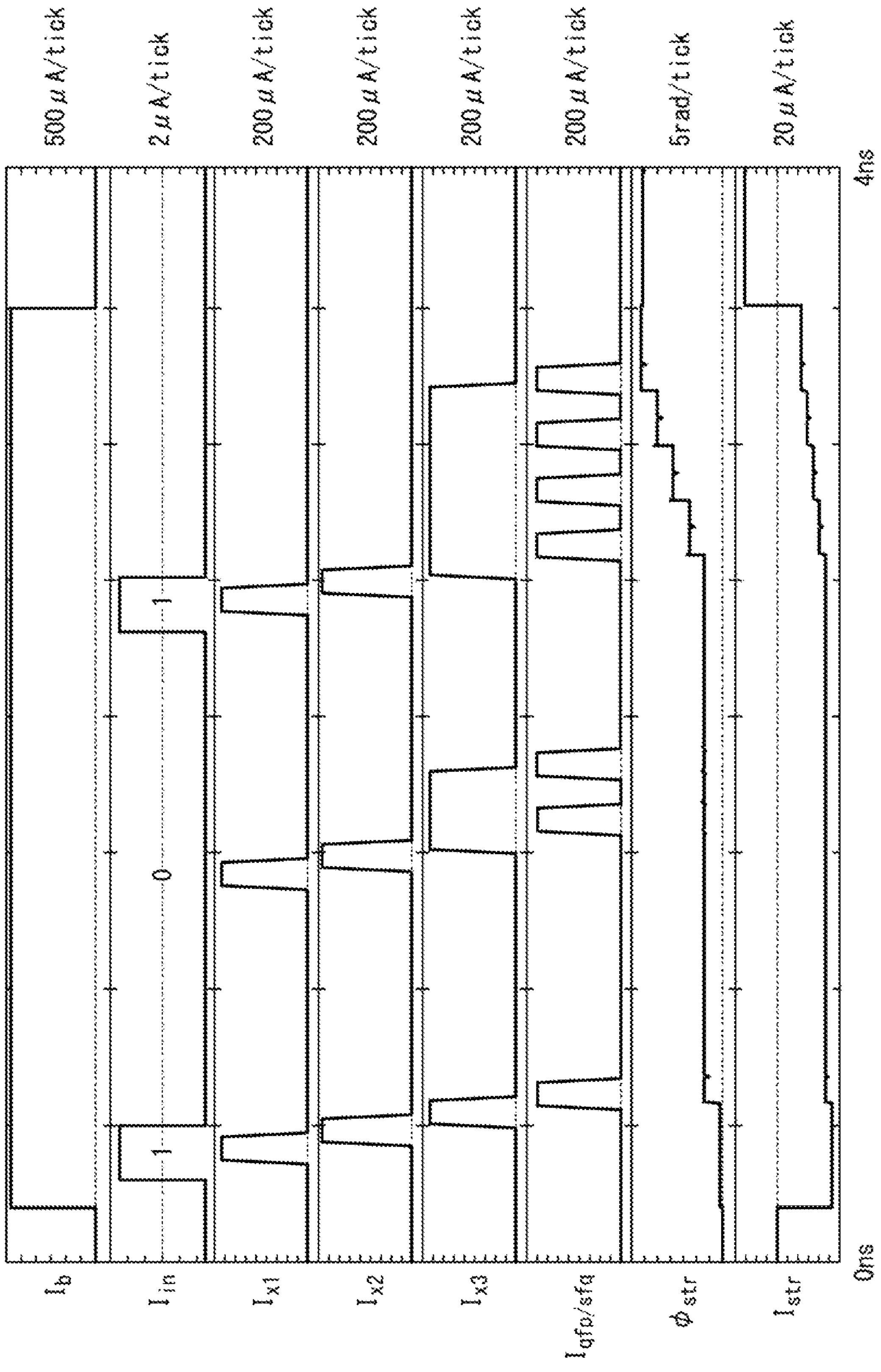
FIG. 19 is a diagram showing an example of various signals flowing through the magnetic flux bias circuit according to the fourth embodiment of the present invention.

FIG. 19 is a diagram showing an example of various signals flowing through the magnetic flux bias circuit 1*e* according to the present embodiment.

The magnetic flux bias circuit 1*e* is a circuit in which the number of stages of the shift register in the magnetic flux bias circuit 1E shown in FIG. 13 is one and the QFP/SFQ interface 200 shown in FIG. 15 is used as the QFP/SFQ interface.

The magnetic flux bias circuit 1*e* includes the first current control line 3, the second current control line 4, the third current control line 5, the interface control line 10, the reset signal line 11, the bias signal line 12, a shift register 70*e*, a QFP/SFQ interface 13*e*, and an SFQ digital/analog converter 14*e*. In the shift register 70*e*, the shift register element 72, the shift register element 73, and the shift register element 74 are connected in series in accordance with the fact that the number of stages of the shift register is one.

A superconducting loop including a Josephson junction Jstr and an inductor Lstr is formed between the Josephson junction Jstr and the inductor Lstr provided in the SFQ digital/analog converter 14*e*. A phase difference ϕstr of the Josephson junction Jstr represents the number of flux quanta stored within the superconducting loop.

A bit string of the input signal Iin is a bit string "101" as an example. As shown in FIG. 19, five flux quanta are stored within the superconducting loop of the SFQ digital/analog converter 14*e* by the input signal Iin with the bit string "101". After writing of the flux quanta to the SFQ digital/analog converter 14*e* has ended, a value of the bias signal Ib becomes zero. A circulating current Istr for holding the five flux quanta finally flows within the superconducting loop.

Summary of Each Embodiment

As described above, the magnetic flux bias circuits 1, 1A, 1B, 1C, 1D, and 1E according to the embodiments each include the input signal line 2, the first current control line 3, the second current control line 4, the third current control line 5, the digital/analog conversion unit (the digital/analog converters 7, 7A, 7B, 7C, 7D, and 7E in the embodiments, respectively), and the magnetic flux application unit (the transformers 8, 8A, 8B, 8C, 8D, and 8E in the embodiments, respectively).

The input signal Iin indicating an applied magnetic flux using a digital value is input to the input signal line 2.

The clock signals (the first excitation current Ix1, the second excitation current Ix2, and the third excitation current Ix3 in each of the embodiments) according to the input signal Iin are respectively input to the first current control line 3, the second current control line 4, and the third current control line 5.

The digital/analog conversion unit 7 converts the input signal Iin into an analog signal using a circuit including the QFP on the basis of the input signal Iin input to the input signal line 2, the clock signals (the first excitation current Ix1, the second excitation current Ix2, the third excitation current Ix3 in the embodiments, respectively) respectively input to the first current control line 3, the second current control line 4, and the third current control line 5.

The magnetic flux application unit (the transformer 8 in each embodiment) applies the applied magnetic flux to the controlled object 9 on the basis of the analog signal output from the digital/analog conversion unit 7.

With this configuration, in the magnetic flux bias circuits 1, 1A, 1B, 1C, 1D, and 1E according to the embodiments, since the number of control lines is constant regardless of the number of the controlled objects 9, a large number of controlled objects can be controlled with a small number of control lines. Here, the "small number" means that the number of control lines does not need to be increased even if the number of controlled objects increases.

In conventional magnetic flux bias circuits, it was necessary to increase the number of control lines as the number of controlled objects increased. On the other hand, in the magnetic flux bias circuits 1, 1A, 1B, 1C, 1D, and 1E according to the embodiments, it is not necessary to increase the number of control lines even if the number of controlled objects increases, and therefore high scalability can be realized.

In conventional magnetic flux bias circuits, a plurality of digital/analog converters were controlled one at a time, and a magnitude of the magnetic flux applied to each of the controlled objects was individually programmed. On the other hand, in the magnetic flux bias circuits 1, 1A, 1B, 1C, 1D, and 1E according to the embodiments, since all the digital/analog converters provided in the digital/analog conversion unit are concurrently controlled, magnitudes of the magnetic fluxes applied to the controlled objects are programed in parallel. Therefore, in the magnetic flux bias circuits 1, 1A, 1B, 1C, 1D, and 1E according to the embodiments, improvement in program speed can be expected.

In addition, power consumption can be reduced by using the QFP in the magnetic flux bias circuits 1, 1A, 1B, 1C, 1D, and 1E according to the embodiments.

Also, in the magnetic flux bias circuit 1E, since there is no need to add an element circuit (that is, the number of junctions does not change) even if the magnetic flux resolution increases, high area efficiency can be expected.

Further, it is conceivable to operate a plurality of magnetic flux bias circuits according to the embodiments in parallel to, for example, improve a program speed. In that case, it is necessary to increase the number of control lines to improve the program speed.

Further, in each of the above-described embodiments, an example of a case in which the magnetic flux bias circuits 1, 1A, 1B, 1C, 1D, and 1E each include three current control lines including the first current control line 3, the second current control line 4, the third current control line 5, but the present invention is not limited thereto. The magnetic flux bias circuit may include four or more current control lines. For example, if the magnetic flux bias circuit includes four current control lines, excitation currents of four types flow through the four current control lines, respectively.

Also, wiring of the current control lines in the magnetic flux bias circuit is not limited to the wiring described above, and other wiring may also be used.

Also, in each of the above-described embodiments, an example of a case in which the excitation currents of three types serve as clock signals has been described, but the present invention is not limited thereto. Of the excitation currents of the three types, two excitation currents may serve as clock signals, and one excitation current may serve as a direct current (DC) offset current. In that case, wiring of the current control line is not limited to the wiring described above, and other wiring may also be used.

Here, as described above, in the first, second, and third embodiments described above, the magnetic flux is applied to the controlled object 9 when the hold signal Ihold is in a high state. Therefore, a current of the hold signal Ihold may affect the controlled object 9 such as a quantum bit.

In each of the magnetic flux bias circuits 1, 1A, 1B, 1C, and 1D, a π junction may be used for the digital/analog converters 71, 71A, 71B, and 71C. If the π junction is used for the digital/analog converters 71, 71A, 71B, and 71C, contrary to the first, second, and third embodiments described above, a magnetic flux is applied to the controlled object 9 when the hold signal Ihold is in a low state. Therefore, a current value of the hold signal Ihold can be reduced to be low during a period in which the magnetic flux is applied to the controlled object 9, and an influence of the current of the hold signal Ihold on the controlled object 9 such as a qubit can be suppressed.

Further, in each of the embodiments described above, a case in which each of the magnetic flux bias circuits 1, 1A, 1B, 1C, and 1D includes the digital/analog converter based on a QFP has been described, but the present invention is not limited thereto. Each of the magnetic flux bias circuits 1, 1A, 1B, 1C, 1D may include a digital/analog converter based on an adiabatic QFP (AQFP) or a directly coupled QFP (DQFP)

in place of the digital/analog converter based on a QFP or together with the digital/analog converter based on a QFP.

Also, in each of the embodiments described above, an example of a case in which each of the magnetic flux bias circuits 1, 1A, 1B, 1C, 1D, and 1E includes the shift register based on a QFP has been described, but the present invention is not limited thereto. Each of the magnetic flux bias circuits 1, 1A, 1B, 1C, 1D, 1E may include a shift register based on an AQFP or DQFP in place of the shift register based on a QFP or together with the shift register based on a QFP.

Further, in each of the embodiments described above, configurations of the shift registers 70 and 70C are examples, and a configuration other than the configuration described in each embodiment may be used. For example, the fourth shift register element may be omitted from the configuration of the shift registers 70 shown in FIG. 1. In that case, an output of the third shift register element (for example, the third shift register element 74-4) is branched into two, in which one output is input to the digital/analog converter (for example, the digital/analog converter 71-4), and the other output is input to the first shift register element (for example, the first shift register element 72-3) provided in a stage adjacent to the stage in which the above-described third shift register element is provided among the stages provided in the shift register 70.

While one embodiment of the present invention has been described in detail above with reference to the drawings, the specific configurations are not limited to those described above, and various changes can be made in design in a range not departing from the gist of the present invention.

REFERENCE SIGNS LIST

1, 1A, 1B, 1C, 1D, 1E Magnetic flux bias circuit
2 Input signal line
3 First current control line
4 Second current control line
Third current control line
6 Hold signal line
60 First hold signal line
61 Second hold signal line
62 Third hold signal line
7 Digital/analog conversion unit
8 Transformer
Iin Input signal
Ix1 First excitation current
Ix2 Second excitation current
Ix3 Third excitation current
9 Controlled object

What is claimed is:

1. A magnetic flux bias circuit comprising:
- an input signal line to which an input signal indicating an applied magnetic flux using a digital value is input;
- a first current control line, a second current control line, and a third current control line to which a clock signal according to the input signal is input;
- a digital/analog conversion unit converting the input signal into an analog signal using a circuit including a quantum flux parametron circuit on the basis of the input signal input to the input signal line and the clock signal input to the first current control line, the second current control line, and the third current control line; and
- a magnetic flux application unit applying an applied magnetic flux to a controlled object on the basis of the analog signal output from the digital/analog conversion unit.

2. The magnetic flux bias circuit according to claim 1, wherein the digital/analog conversion unit and the magnetic flux application unit are each provided in a number corresponding to the number of the controlled objects.

3. The magnetic flux bias circuit according to claim 1, wherein the digital/analog conversion unit includes:
- a digital/analog converter; and
- a shift register in which shift register elements based on a quantum flux parametron circuit are connected.

4. The magnetic flux bias circuit according to claim 3, wherein
- the digital/analog conversion unit includes the digital/analog converter in a number corresponding to the number of bits of the input signal,
- the shift register elements are connected in multiple stages corresponding to the number of bits in the shift register,
- the shift register includes a first shift register element, a second shift register element, a third shift register element, and a fourth shift register element in each of the multiple stages corresponding to the number of bits,
- in each of the multiple stages, the first shift register element, the second shift register element, and the fourth shift register element are connected in series by the input signal line in an order of the first shift register element, the second shift register element, and the fourth shift register element, and the third shift register element and the fourth shift register element are connected in parallel by the input signal line,
- in each of the multiple stages, the clock signal is input from the first current control line to the first shift register element, the clock signal is input from the second current control line to the second shift register element, and the clock signal is input from the third current control line to the third shift register element and the fourth shift register element, and
- the digital/analog converter outputs the analog signal based on a current value output from the third shift register element in each of the multiple stages.

5. The magnetic flux bias circuit according to claim 4, wherein
- the number of digital/analog converters included in the digital/analog conversion unit is larger than the number of bits, and
- a plurality of the digital/analog converters are associated with one or more bits among the bits of the input signal.

6. The magnetic flux bias circuit according to claim 3, further comprising a hold signal line to which a hold signal for holding a current value output from the shift register is input, wherein
- the hold signal is input to the digital/analog converter from the hold signal line.

7. The magnetic flux bias circuit according to claim 3, in which the digital/analog converter is a single flux quantum circuit holding a flux quantum within a superconducting loop on the basis of an input voltage pulse, the magnetic flux bias circuit further comprising:
- an interface circuit converting a current output from the quantum flux parametron circuit into a voltage pulse;
- a reset signal line to which a reset signal for resetting the flux quantum held by the single flux quantum circuit is input; and
- a bias signal line to which a bias signal for biasing the superconducting loop is input, wherein
- the interface circuit, the single flux quantum circuit, and the magnetic flux application unit are each provided in a number corresponding to the number of the controlled objects, a plurality of the single flux quantum circuits each hold a flux quantum within the superconducting loop on the basis of the voltage pulse output from each of a plurality of the interface circuits, and the magnetic flux application unit applies an applied magnetic flux to each of a plurality of the controlled objects on the basis of the flux quantum held by each of the plurality of the single flux quantum circuits.

* * * * *